(12) United States Patent
Park et al.

(10) Patent No.: US 10,645,831 B2
(45) Date of Patent: May 5, 2020

(54) ELECTRIC DEVICE WITH SEAL MEMBER

(71) Applicant: Samsung Electronics Co., Ltd., Suwon-si, Gyeonggi-do (KR)

(72) Inventors: Jinyoung Park, Suwon-si (KR); Daeyoung Noh, Seoul (KR); Chankeun Song, Seoul (KR); Minsung Lee, Suwon-si (KR); Yongseok Lee, Seoul (KR); Minsu Jung, Seoul (KR); Sungjoo Cho, Bucheon-si (KR); Youngsik Choi, Hwaseong-si (KR); Minwoo Yoo, Osan-si (KR); Byounguk Yoon, Hwaseong-sI (KR); Jongchul Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/248,236

(22) Filed: Jan. 15, 2019

(65) Prior Publication Data

US 2019/0150307 A1    May 16, 2019

Related U.S. Application Data

(63) Continuation of application No. 15/490,215, filed on Apr. 18, 2017, now Pat. No. 10,225,941.

(30) Foreign Application Priority Data

May 27, 2016 (KR) .......................... 10-2016-0065333

(51) Int. Cl.
*H05K 7/00* (2006.01)
*H05K 5/02* (2006.01)
*H04B 1/3816* (2015.01)
*H04M 1/02* (2006.01)
(Continued)

(52) U.S. Cl.
CPC ......... *H05K 5/0295* (2013.01); *H04B 1/3816* (2013.01); *H04M 1/026* (2013.01); *H04M 1/0249* (2013.01); *H04M 1/18* (2013.01); *H05K 5/0217* (2013.01); *H05K 7/1461* (2013.01)

(58) Field of Classification Search
USPC ......................................................... 361/728
See application file for complete search history.

(56) References Cited

U.S. PATENT DOCUMENTS

| 9,954,328 B2 | 4/2018 | Motohashi et al. |
| 10,310,562 B2 * | 6/2019 | Choi .................. G06F 1/1656 |
| 2011/0294322 A1 | 12/2011 | Kikuchi et al. |

(Continued)

FOREIGN PATENT DOCUMENTS

| JP | 2014-160004 A | 9/2014 |
| JP | 2015-106554 A | 6/2015 |

(Continued)

*Primary Examiner* — Hung S. Bui
(74) *Attorney, Agent, or Firm* — Jefferson IP Law, LLP

(57) ABSTRACT

An electronic device with a seal member is provided. The electronic device includes a tray configured to slide in and out of the electronic device, an opening, (e.g., a hole) formed at one side of the tray, for communicating outside of the electronic device, a socket disposed in the electronic device, the tray slides into or from the socket, and a seal member, disposed between the opening and the socket, for performing a waterproof and dustproof function. Various types of the seal member may be implemented.

20 Claims, 36 Drawing Sheets

(51) Int. Cl.
*H04M 1/18* (2006.01)
*H05K 7/14* (2006.01)

(56) References Cited

U.S. PATENT DOCUMENTS

| | | |
|---|---|---|
| 2013/0267106 A1 | 10/2013 | Jenks |
| 2014/0233359 A1 | 8/2014 | Ishida et al. |
| 2015/0155651 A1 | 6/2015 | Ejiri |
| 2015/0201518 A1* | 7/2015 | Hsu .................. H05K 7/1461 |
| | | 361/807 |
| 2015/0270639 A1* | 9/2015 | Yu .................. H01R 13/5219 |
| | | 439/271 |
| 2016/0111802 A1 | 4/2016 | Shimotsu et al. |
| 2016/0352042 A1 | 12/2016 | Wankoff et al. |
| 2017/0070002 A1* | 3/2017 | Do .................. H01R 13/635 |

FOREIGN PATENT DOCUMENTS

| | | |
|---|---|---|
| KR | 10-2006-0040445 A | 5/2006 |
| WO | 2016/054392 A1 | 4/2016 |

* cited by examiner

FIG. 17
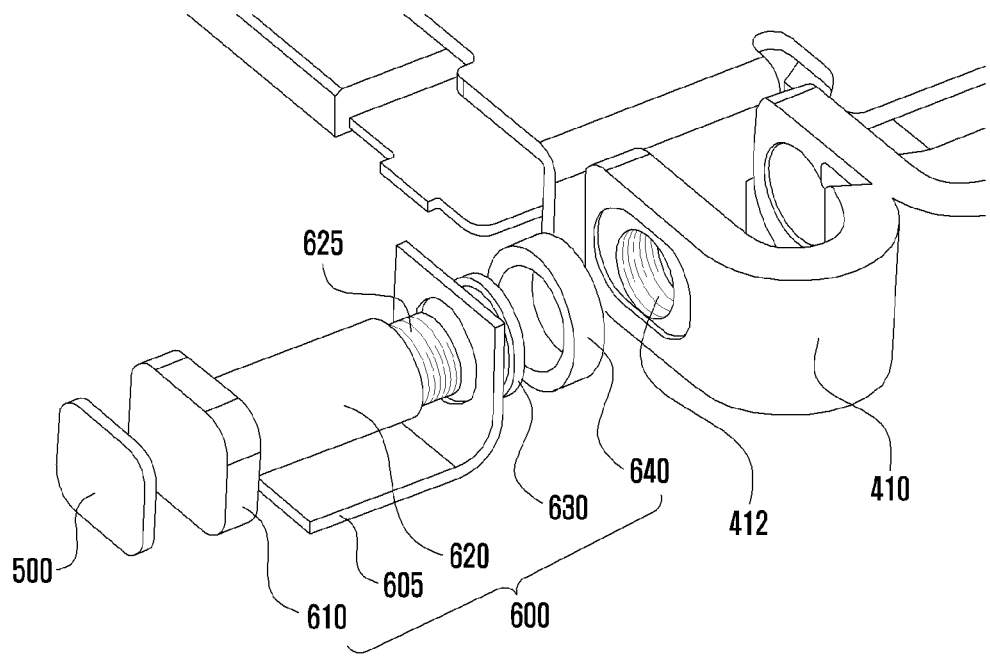
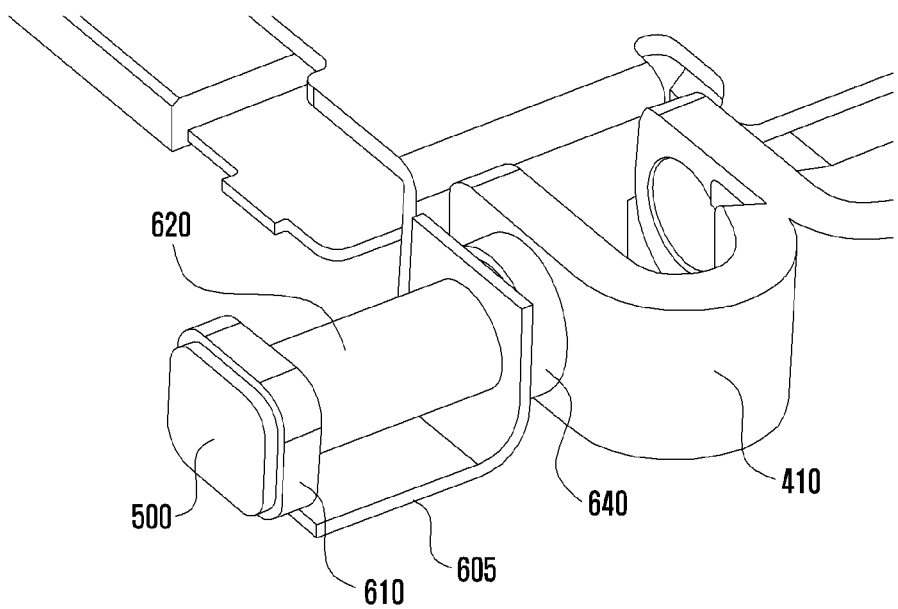

ELECTRIC DEVICE WITH SEAL MEMBER

CROSS-REFERENCE TO RELATED APPLICATION(S)

This application is a continuation application of prior application Ser. No. 15/490,215, filed on Apr. 18, 2017, which was based on and claimed priority under 35 U.S.C § 119(a) of a Korean patent application number 10-2016-0065333, filed on May 27, 2016, in the Korean Intellectual Property Office, the disclosure of which is incorporated by reference herein in its entirety.

TECHNICAL FIELD

The present disclosure relates to an electronic device with a seal member.

BACKGROUND

In general, mobile electronic devices are capable of performing various functions in wireless communication, such as making a call, exchanging messages with other electronic devices, Internet searching, etc.

Mobile electronic devices are capable of including a memory card and/or a subscriber identification module (SIM) which stores a user's information, etc.

The SIM card and/or a memory card may be placed in a tray, and the tray slides in/out of a socket of a mobile electronic device in the way that a drawer slides.

Mobile electronic devices have an opening (e.g., a hole) which is used to eject a tray from the socket.

Mobile electronic devices have been equipped with a separate accessory in order to prevent foreign materials, such as water, dust, etc., from entering the opening (hole). The separate accessory is configured in such a way that a seal member is installed or inserted into the separate accessory. The separate accessory with a seal member is inserted into the opening (hole), thereby preventing the entry of foreign materials from the opening.

However, existing separate accessories have a limit of mobility and flexibility by a pushing force in the opening (hole) of the electronic devices, which is caused when the seal member is installed or inserted into the accessories.

When mobile electronic devices are dropped on the floor, the falling impact may be applied to the separate accessory. In this case, the separate accessory may stick to the socket receiving a tray, and this may cause a problem of not ejecting the tray from the socket.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide an electronic device which includes an opening (e.g., a hole) formed to eject a tray, and is capable of performing a waterproof and dustproof function, using an accessory, such as a pressing member and a seal member, formed on the inner wall of the electronic device.

In accordance with an aspect of the present disclosure, an electronic device is provided. The electronic device includes a tray configured to slide in and out of the electronic device, an opening (e.g., a hole), formed at one side of the tray, for communication with outside of the electronic device, a socket disposed in the electronic device, the tray further configured to slide into or from the socket, and a seal member, disposed between the opening and the socket, for performing a waterproof and dustproof function. The seal member comprises a first end that is open and a second end that is closed. The seal member is configured to be extended or contracted based on whether the seal member is pressed by a tray ejector pin passing through the opening.

In accordance with another aspect of the present disclosure, an electronic device is provided. The electronic device includes a tray configured to slide in and out of the electronic device, an opening, (e.g., a hole) formed at one side of the tray, for communicating with outside of the electronic device, a socket disposed in the electronic device, the tray further configured to slide into or from the socket, a guide unit, coupled to an inside of the opening, for guiding a tray ejector pin moving with force, and a seal member, disposed between the guide unit and the socket, for performing a waterproof and dustproof function. The seal member includes a first end, an inside of the first end forms a receiving groove, a body part which has a thickness and is united with the first end, and a second end shaped as a rod, the second end is integrated with the body part and extends from the center of the body part, and the second end is configured to be inserted into and fixed to an insertion hole formed in the actuator of the socket.

In accordance with another aspect of the present disclosure, an electronic device is provided. The electronic device includes a tray configured to slide in and out of the electronic device, an opening, formed at one side of the tray, for communicating outside of the electronic device, a socket disposed in the electronic device, the tray further configured to slide into or from the socket, a seal member, disposed between the opening and the socket, for performing a waterproof and dustproof function, and a pressing member, disposed at one side of the seal member, for transferring force that a tray ejector pin applies to the seal member to an actuator of the socket. The pressing member includes a head to one side of which the seal member is adhered and a body integrally coupled to another side of the head, wherein one end of the body is coupled to the actuator of the socket.

In accordance with another aspect of the present disclosure, an electronic device is provided. The electronic device includes a tray configured to slide in and out of the electronic device, an opening (e.g., a hole) formed, at one side of the tray, for communicating with outside of the electronic device, a socket disposed in the electronic device, the tray further configured to slide into or from the socket, a seal member, disposed between the opening and the socket, for performing a waterproof and dustproof function, and a pressure transmission unit, disposed at one side of the seal member, for transferring force that a tray ejector pin applies to the seal member to an actuator of the socket. The pressure transmission unit moves up and down according to a condition as to whether a tray ejector pin passing through the opening presses the pressure transmission unit by a hinge spring installed closed to the pressure transmission unit.

In accordance with another aspect of the present disclosure, an electronic device is provided. The electronic device includes a tray configured to slide in and out of the electronic device, an opening, (e.g., a hole) formed at one side of the tray, for communicating with outside of the electronic device, a socket disposed in the electronic device, the tray further configured to slide into or from the socket, a seal member, disposed between the opening and the socket, for performing a waterproof and dustproof function, and a pressure leaf spring, disposed at one side of the seal member, for transferring force that a tray ejector pin applies to the seal member to an actuator of the socket. The pressure leaf spring includes a first leaf spring formed as a curved surface such that one end thereof is fixed to an inner frame and another end thereof is bent downward, and a second leaf spring formed as a curved surface such that one end thereof is bent upward and another end thereof is fixed to the inner frame. The curved surface of the other end of the first leaf spring and the curved surface of the one end of the second leaf spring form a contact. The contact configured to move up and down.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which:

FIGS. 17 and 18 illustrate views of a seal member and a pressing member, according to various embodiments of the present disclosure;

Throughout the drawings, it should be noted that like reference numbers are used to depict the same or similar elements, features, and structures.

DETAILED DESCRIPTION

Figure 1A:
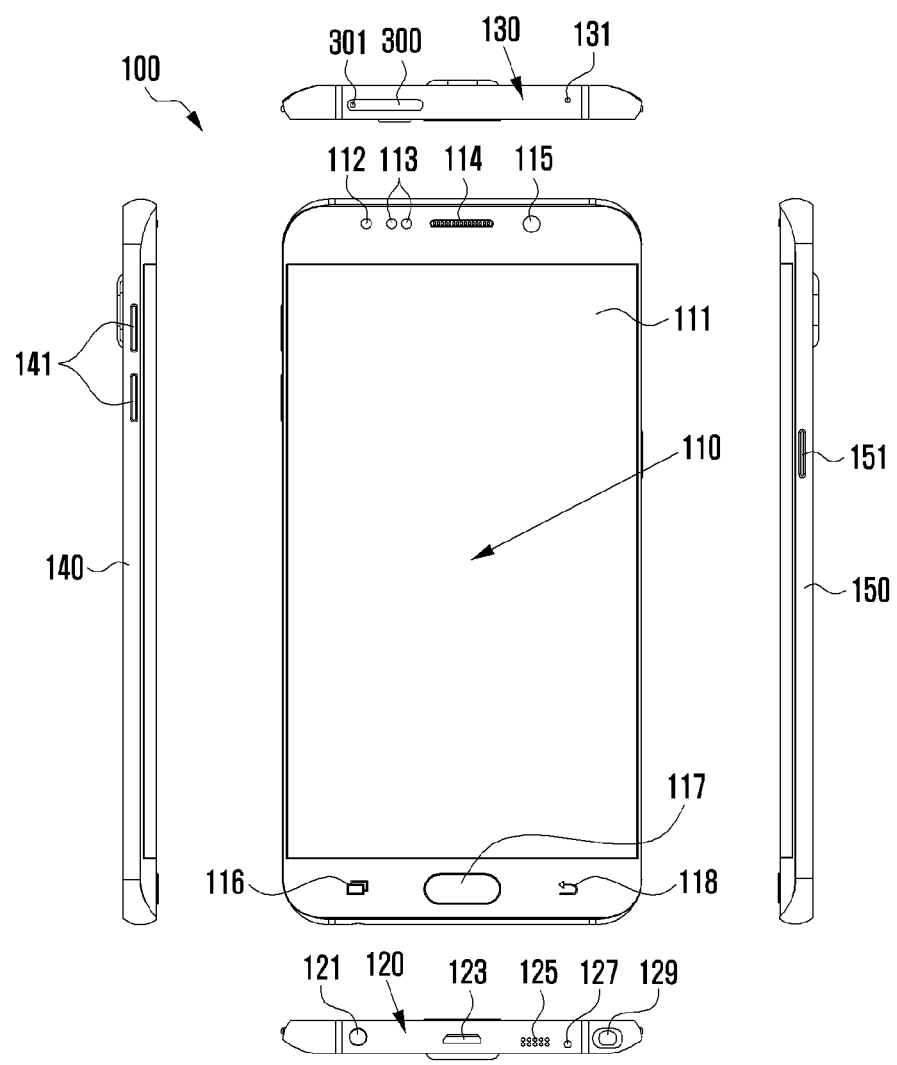
FIG. 1A illustrates views of an electronic device according to various embodiments of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The terms "have," "may have," "include," and "may include" as used herein indicate the presence of corresponding features (for example, elements such as numerical values, functions, operations, or parts), and do not preclude the presence of additional features.

The terms "A or B," "at least one of A or/and B," or "one or more of A or/and B" as used herein include all possible combinations of items enumerated with them. For example, "A or B," "at least one of A and B," or "at least one of A or B" means (1) including at least one A, (2) including at least one B, or (3) including both at least one A and at least one B.

The terms such as "first" and "second" as used herein may modify various elements regardless of an order and/or importance of the corresponding elements, and do not limit the corresponding elements. These terms may be used for the purpose of distinguishing one element from another element. For example, a first user device and a second user device may indicate different user devices regardless of the order or importance. For example, a first element may be referred to as a second element without departing from the scope the present disclosure, and similarly, a second element may be referred to as a first element.

It will be understood that, when an element (for example, a first element) is "(operatively or communicatively) coupled with/to" or "connected to" another element (for example, a second element), the element may be directly coupled with/to another element, and there may be an intervening element (for example, a third element) between the element and another element. To the contrary, it will be understood that, when an element (for example, a first element) is "directly coupled with/to" or "directly connected to" another element (for example, a second element), there is no intervening element (for example, a third element) between the element and another element.

The expression "configured to (or set to)" as used herein may be used interchangeably with "suitable for," "having the capacity to," "designed to," "adapted to," "made to," or "capable of" according to a context. The term "configured to (set to)" does not necessarily mean "specifically designed to" in a hardware level. Instead, the expression "apparatus configured to . . . " may mean that the apparatus is "capable of . . . " along with other devices or parts in a certain context. For example, "a processor configured to (set to) perform A, B, and C" may mean a dedicated processor (e.g., an embedded processor) for performing a corresponding operation, or a generic-purpose processor (e.g., a central processing unit (CPU) or an application processor) capable of performing a corresponding operation by executing one or more software programs stored in a memory device.

The terms used in describing various embodiments of the present disclosure are for the purpose of describing particular embodiments and are not intended to limit the present disclosure. As used herein, the singular forms are intended to include the plural forms as well, unless the context clearly indicates otherwise. All of the terms used herein including technical or scientific terms have the same meanings as those generally understood by an ordinary skilled person in the related art unless they are defined otherwise. The terms defined in a generally used dictionary should be interpreted as having the same or similar meanings as the contextual meanings of the relevant technology and should not be interpreted as having ideal or exaggerated meanings unless they are clearly defined herein. According to circumstances, even the terms defined in this disclosure should not be interpreted as excluding the embodiments of the present disclosure.

Electronic devices according to embodiments of the present disclosure may include at least one of, for example, smart phones, tablet personal computers (PCs), mobile phones, video telephones, electronic book readers, desktop PCs, laptop PCs, netbook computers, workstations, servers, personal digital assistants (PDAs), portable multimedia players (PMPs), Motion Picture Experts Group (MPEG-1 or MPEG-2) Audio Layer 3 (MP3) players, mobile medical devices, cameras, or wearable devices. According to an embodiment of the present disclosure, the wearable devices may include at least one of accessory-type wearable devices (e.g., watches, rings, bracelets, anklets, necklaces, glasses, contact lenses, or head-mounted-devices (HMDs)), fabric or clothing integral wearable devices (e.g., electronic clothes), body-mounted wearable devices (e.g., skin pads or tattoos), or implantable wearable devices (e.g., implantable circuits).

The electronic devices may be smart home appliances. The smart home appliances may include at least one of, for example, televisions (TVs), digital versatile disc (DVD) players, audios, refrigerators, air conditioners, cleaners, ovens, microwave ovens, washing machines, air cleaners, set-top boxes, home automation control panels, security control panels, TV boxes (e.g., Samsung HomeSync™, Apple TV™, or Google TV™), game consoles (e.g., Xbox™ and PlayStation™), electronic dictionaries, electronic keys, camcorders, or electronic picture frames.

The electronic devices may include at least one of various medical devices (e.g., various portable medical measurement devices (such as blood glucose meters, heart rate monitors, blood pressure monitors, or thermometers, and the like), a magnetic resonance angiography (MRA) device, a magnetic resonance imaging (MRI) device, a computed tomography (CT) device, scanners, or ultrasonic devices, and the like), navigation devices, global positioning system (GPS) receivers, event data recorders (EDRs), flight data recorders (FDRs), vehicle infotainment devices, electronic equipment for vessels (e.g., navigation systems, gyrocompasses, and the like), avionics, security devices, head units for vehicles, industrial or home robots, automatic teller machines (ATMs), points of sales (POSs) devices, or Internet of Things (IoT) devices (e.g., light bulbs, various sensors, electric or gas meters, sprinkler devices, fire alarms, thermostats, street lamps, toasters, exercise equipment, hot water tanks, heaters, boilers, and the like).

The electronic devices may further include at least one of parts of furniture or buildings/structures, electronic boards, electronic signature receiving devices, projectors, or various measuring instruments (such as water meters, electricity meters, gas meters, or wave meters, and the like). The electronic devices may be one or more combinations of the above-mentioned devices. The electronic devices may be flexible electronic devices. Also, the electronic devices are not limited to the above-mentioned devices, and may include new electronic devices according to the development of new technologies.

Hereinafter, electronic devices according to various embodiments of the present disclosure will be described with reference to the accompanying drawings. The term "user" as used herein may refer to a person who uses an electronic device or may refer to a device (e.g., an artificial intelligence electronic device) which uses an electronic device.

Figure 1B:
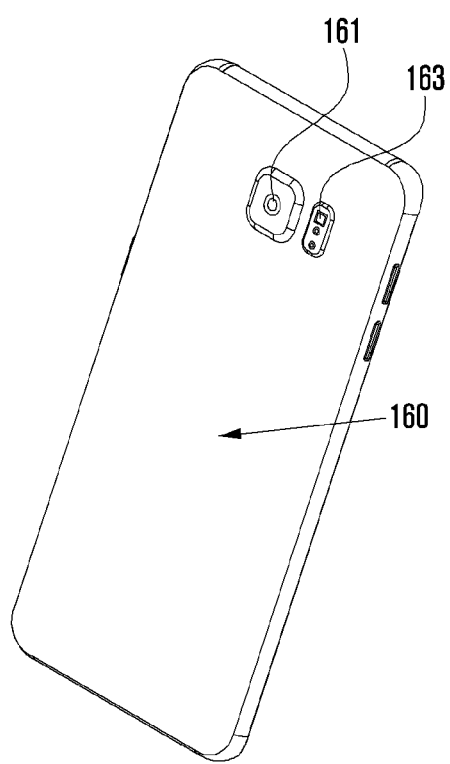
FIG. 1B illustrates a rear-side perspective view of an electronic device according to various embodiments of the present disclosure.

FIGS. 1A and 1B show views of an electronic device according to various embodiments of the present disclosure.

Referring to FIG. 1A, FIG. 1A illustrates a front view, a top view, a bottom view, a first side view and a second side view of an electronic device according to various embodiments of the present disclosure. FIG. 1B illustrates a rear-side perspective view of an electronic device according to various embodiments of the present disclosure.

Referring to FIGS. 1A and 1B, the electronic device 100 according to various embodiments of the present disclosure is configured to include a front side 110, a bottom side 120, a top side 130, a first side 140, a second side 150 and a back side 160.

In various embodiments, the electronic device 100 is capable of including a window 111, a light-emitting diode (LED) hole 112, sensor holes 113, a receiver hole 114, a front camera hole 115, a recent apps key 116, a home key 117 and a cancel key (back key) 118 in the front side 110.

In various embodiments, the LED hole 112, sensor holes 113, receiver hole 114 and front camera hole 115 are disposed in the top area of the front side 110.

The window 111 forms the front side 110. The window 111 is capable of displaying videos/images and receiving user touch inputs. To this end, the window 111 is capable of including a display and a touch screen panel.

The LED hole 112 is disposed in the front side 110 so that it corresponds to an LED inside the electronic device 100. For example, a built-in LED indicates operation states of the electronic device 100 through the LED hole 112 by emitting light, e.g., a charging state by emitting red light, a charging complete state by emitting green light, a state where a text message has been received from the outside by blinking blue light, etc.

The sensor holes 113 are formed in the electronic device 100 so that they correspond to one or more sensors that is/are installed in the electronic device 100. The sensors are capable of measuring physical quantities, detecting operation states of the electronic device 100, and converting measured or detected results into electrical signals. Examples of the sensor are a gesture sensor, a proximity sensor, a grip sensor, a gyro sensor, an acceleration sensor, a terrestrial magnetism sensor, a pressure sensor, a temperature/moisture sensor, a hall sensor, a red, green, and blue (RGB) light sensor, an illuminance sensor, a biometric sensor, an ultra violet (UV) sensor, etc.

An audio system of the electronic device 100, such as a built-in speaker, converts an electrical signal into sound, and outputs the sound through the receiver hole 114. To this end, the receiver hole 114 may be disposed in first and second sides 140 and 150 and a back side 160 of the electronic device 100.

The front camera hole 115 is disposed in the front side of the electronic device 100 so that it corresponds to a built-in camera for taking images or video from the front side.

In various embodiments, the electronic device 100 is capable of including a number keys, such as a recent apps key 116, a home key 117, a back key 118, etc., at the bottom area of the front side 110. The keys may be designed in various forms, e.g., a press key/button, a touch key, etc.

The recent apps key 116 is capable of displaying a list of a user's recently executed applications (or apps) or executing a split screen view mode.

The home key 117 is capable of unlocking a screen lock and executing a home screen.

The back key 118 is capable of returning to the previous screen or executing menus which can be used on the current screen.

In various embodiments, the electronic device 100 is capable of including a jack plug 121, a port 123, a first microphone 125, a speaker hole 127 and a pen slot 129 in the bottom side 120.

The jack plug 121 receives and electrically connects to a plug of accessories, such as earphones, an earshot, a headset, etc.

The port 123 serves as an interface for electrically connecting to other electronic devices. The port 123 may connect to at least one of the following: an ear jack, a charge jack, and a communication jack. For example, the port 123 connects to a plug for a high-definition multimedia interface (HDMI), a universal serial bus (USB), a projector, a D-sub-miniature (D-sub) cable, etc.

The first microphone 125 is capable of converting a user's voice into an electrical signal and inputting the electrical signal to the electronic device 100.

The audio system built-in the electronic device 100 converts an electrical signal into sound, and outputs the sound through the speaker hole 127.

The pen slot 129 receives and stores a touch pen with which the user draws a picture or writes for text on the window 111.

In various embodiments, the top side 130 of the electronic device 100 is capable of including a second microphone 131, a tray 300, and an opening (hole) 301.

The second microphone 131 is capable of: receiving a user's voice, e.g., a voice when the user makes a call in a speakerphone mode, without holding the electronic device 100 to his/her ear; converting the received voice into an electrical signal; and inputting the electrical signal to the electronic device 100.

The tray 300 is capable of receiving a subscriber identification module (SIM) card and/or memory card, etc., and slides in/out of a socket of the electronic device 100, in the way that a drawer slides.

The opening (hole) 301 is used to eject the tray 300 from the electronic device 100 by a tray ejector pin.

The tray 300 and the socket in the electronic device 100 will be described in detail later with reference to FIG. 3.

In various embodiments, the electronic device 100 is capable of including a volume control button 141 in the first side 140. The volume control button 141 adjusts a level of sound or bell sound/ringtone, etc., output from the electronic device 100.

The first side 140 may be referred to as the left lateral side of the electronic device 100, seen from the front side 110.

In various embodiments, the electronic device 100 is capable of including a power on/off button 151 in the second side 150. The power on/off button 151 is a button for tuning on/off the electronic device 100.

The second side 150 may be referred to as the right lateral side of the electronic device 100, seen from the front side 110.

In various embodiments, the electronic device 100 is capable of including a rear camera 161 and a flash window 163 in the back side 160.

The rear camera 161 takes images or videos from the back side of the electronic device 100. The rear camera 161 is capable of including one or more image sensors and image signal processors (ISPs).

The flash window 163 is disposed near the rear camera 161, corresponding to the flash for emitting light, or an additional amount of light, according to the settings for the image and/or video shooting mode.

Figure 2:
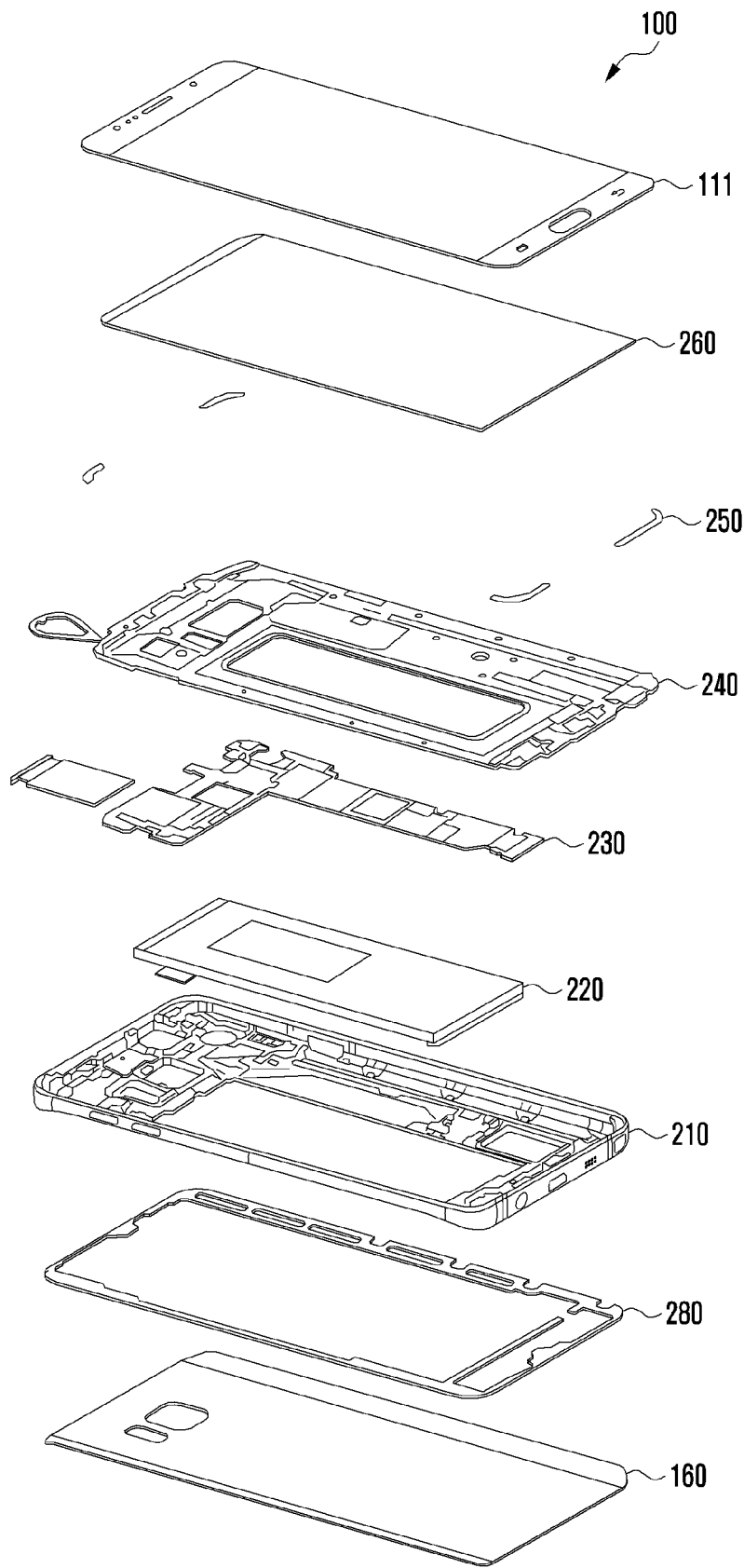
FIG. 2 is an exploded perspective view of an electronic device according to various embodiments of the present disclosure.

FIG. 2 is an exploded perspective view of an electronic device according to various embodiments of the present disclosure.

Referring to FIG. 2, an electronic device 100 according to the present disclosure is capable of including a housing 210, a battery 220, a printed board assembly (PBA) 230, an inner frame 240, a front adhesive tape 250, a display 260, a window 111, a rear adhesive tape 280 and a back side 160.

The housing 210 receives the bottom side 120, top side 130, first side 140 and second side 150 of the electronic device 100, shown in FIG. 1, which are integrally formed into a single body. The housing 210 also forms a space for receiving various parts such as the battery 220, PBA 230, inner frame 240, front adhesive tape 250, display 260, and window 111.

The battery 220 is placed in the housing 210 and supplies power to the electronic device 100.

The PBA 230 is equipped with a processor, a memory, a communication interface, a near field communication (NFC)/magnetic secure transmission (MST) antenna and various sensors, which are required for the operation of the electronic device 100, and includes a printed circuit board (PCB) and a field programmable circuit board (FPCB) where various contacts/terminals/ports are formed.

The inner frame 240 is referred to as a bracket designed in such a way that the electronic device 100 is relatively thinner in thickness and relatively more durable. The inner frame 240 protects parts built in the electronic device 100 against the external impact.

The front adhesive tape 250 is capable of adhering the inner frame 240 to the display 260. The front adhesive tape 250 is also capable of performing a waterproof function.

The display 260 is capable of displaying menus of the electronic device 100 and information input by the user or information to be provided to the user. The display 260 is implemented with a liquid crystal display (LCD), an organic light emitted diode (OLED), an active matrix organic light emitted diode (AMOLED), a flexible display, a transparent display, etc.

The window 111 is disposed on the display 260. The window 111 may also be disposed, to be touchable, in part of the first side 140 and the second side 150.

The rear adhesive tape 280 is capable of adhering the housing 210 and the back side 160. The rear adhesive tape 280 is also capable of performing a waterproof function.

Figure 3:
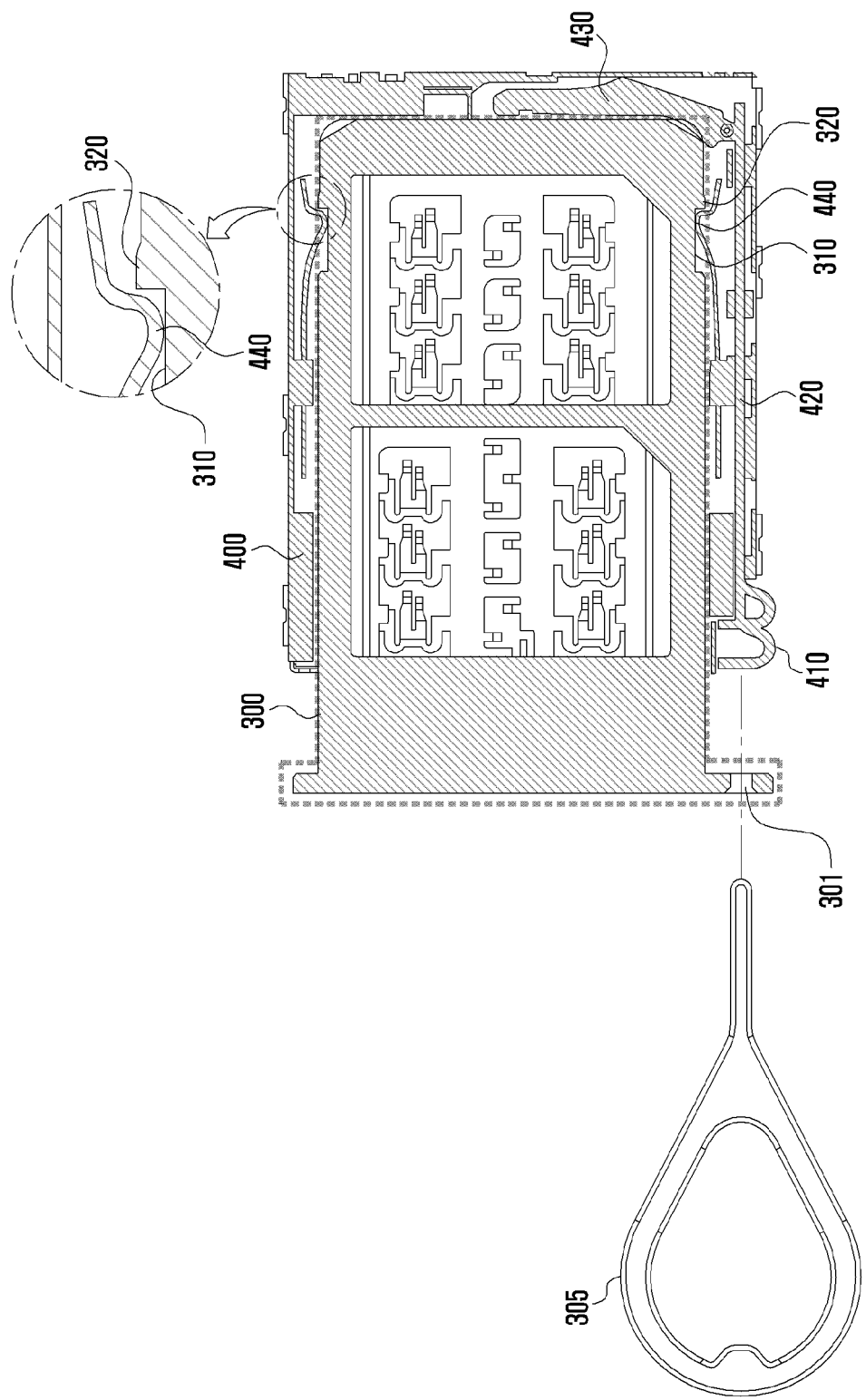
FIG. 3 is a diagram illustrating a socket of an electronic device into which a tray slides in according to various embodiments of the present disclosure.

FIG. 3 is a diagram illustrating a socket of an electronic device into which a tray slides in according to various embodiments of the present disclosure.

An electronic device 100 according to various embodiments of the present disclosure includes a tray 300 on the top side 130 and a socket 400 inside the top side 130, which the tray 300 slides in/out of.

In various embodiments, when the tray 300 where and SIM card and/or memory card, etc. is placed slides in the socket 400, contacts of the PBA 230 built in the electronic device 100 are connected to those of the SIM card and/or memory card, etc., so that the electronic device 100 can read out information from the SIM card and/or memory card.

Referring to FIG. 3, the tray 300 of the electronic device 100 is shaped as a rectangle of an area. The tray 300 may include an opening (hole) 301, latching protrusion receiving grooves 310 and drawing-out sliding units 320.

The tray 300 forms the opening (hole) 301 at one side of the outside. The opening (hole) 301 is used to receive a tray ejector pin 305 for ejecting the tray 300 from the socket 400.

The tray 300 forms the latching protrusion receiving grooves 310 at both of the opposite sides, each of which is shaped at a groove (e.g., a square groove). The latching protrusion receiving grooves 310 hold latching protrusions 440 of the socket 400 which will be described later.

The drawing-out sliding unit 320 is formed to be protrudent at one edge of the latching protrusion receiving groove 310. As shown in FIG. 3, when the latching protrusion 440 of the socket 400 is removed from the latching protrusion receiving groove 310, it may smoothly slide in the inner direction of the socket 400 through the drawing-out sliding unit 320.

In various embodiments, the socket 400 of the electronic device 100 is capable of including an actuator 410, a push rod 420, a push lever 430 and a latching protrusion 440.

The actuator 410 receives force (e.g., push force) applied by the tray ejector pin 305 passing through the opening (hole) 301 of the tray 300 and transfers the force to the push rod 420. That is, the actuator 410 may be a surface that the tray ejector pin 305 passing through the opening (hole) 301 of the tray 300 contacts (i.e., a contact surface). It should be understood that the actuator 410 may be implemented with any type of form if it can receive force from the tray ejector pin 305 and transfer the force to the push rod 420.

One end of the push rod 420 is united with the actuator 410. The push rod 420 receives the push force from the actuator 410 and moves in the lower direction.

One end of the push lever 430 is pivotally coupled to the other end of the push rod 420. When the push lever 430 moves in the lower direction of the push rod 420, the other end of the push lever 430 lifts up a spot in the inner side of the tray 300.

The latching protrusion 440 may be formed in such a way that its one end is fixed to a spot of the socket 400 and the other end is protruded and moves in the inner side. That is, the other end of the latching protrusion 440 is hooked and held by the latching protrusion receiving groove 310 of the tray 300 or removed from the latching protrusion receiving groove 310 and slid into the socket 400.

Figure 4A:
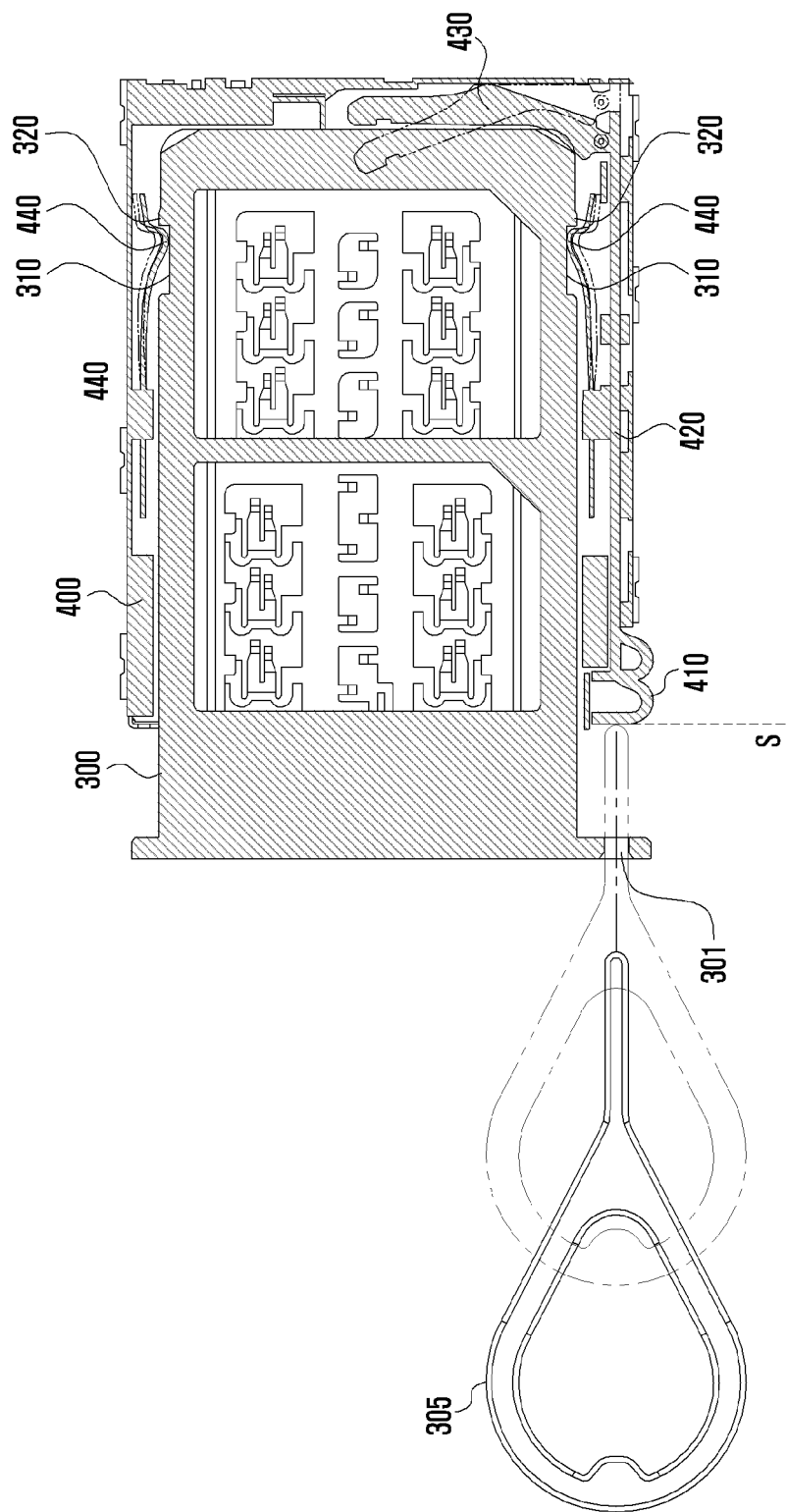
FIGS. 4A and 4B illustrate diagrams that describe a process where a tray installed to the top lateral side of the electronic device slides out of a socket of the electronic device according to various embodiments of the present disclosure.
Figure 4B:
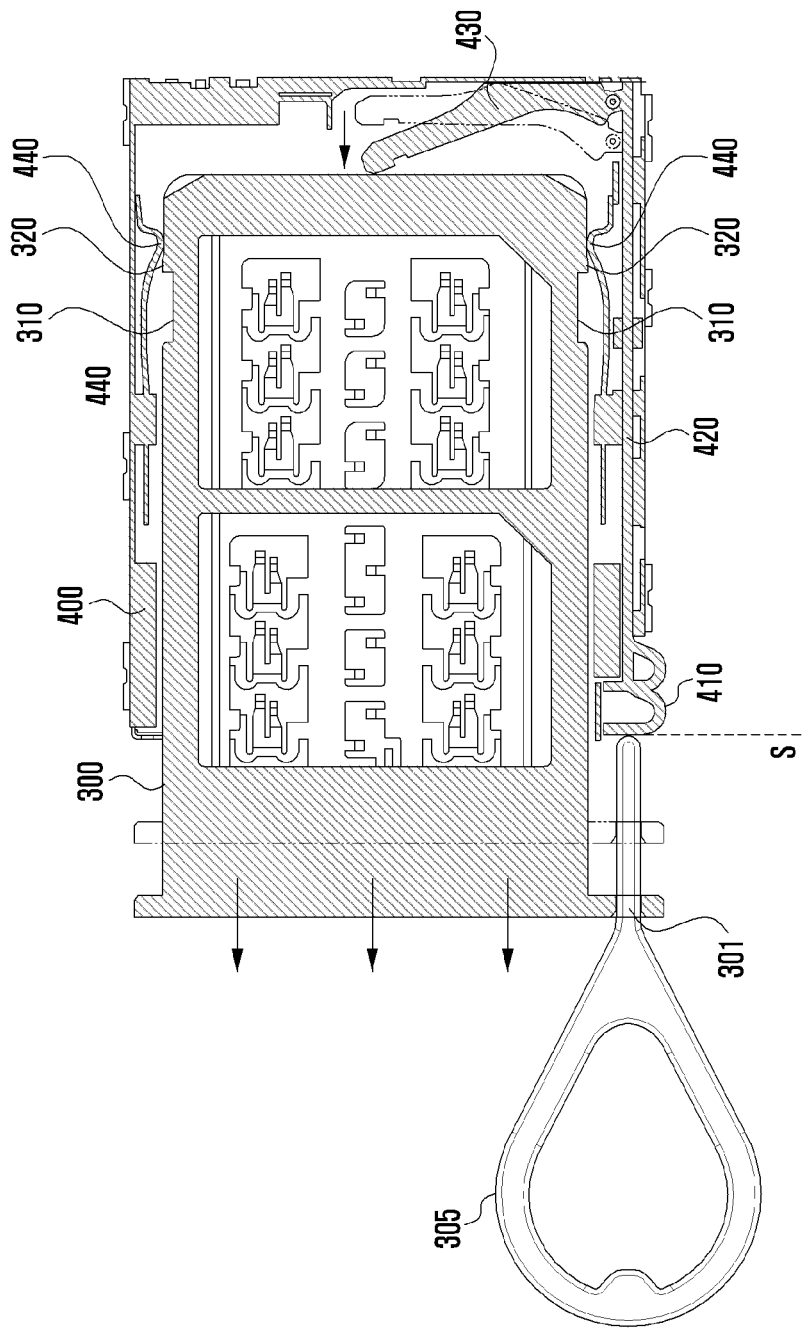

FIGS. 4A and 4B show diagrams that describe a process where a tray installed to the top lateral side of the electronic device slides out of a socket of the electronic device according to various embodiments of the present disclosure.

Referring to FIGS. 4A and 4B, the tray 300 is slid into the socket 400 of the electronic device 100.

If a SIM card and/or memory card placed in the tray 300 needs to be replaced, the user inserts a tray ejector pin 305 into the opening (hole) 301 of the tray 300.

The end of the tray ejector pin 305 inserted into the opening (hole) 301 may contact the surface (e.g., a location S shown in FIG. 4A) formed at the end of the actuator 410 in the socket 400.

If the user pushes the tray ejector pin 305 in the inner direction of the socket 400, the actuator 410 receives the push force through the tray ejector pin 305, and the push rod 420 united with the actuator 410 applies the push force to the push lever 430.

If one end of the push lever 430 receives the push force, the other end of the push lever 430 pushes a spot in the inner side of the tray 300 in the upper direction.

When the other end of the push lever 430 pushes the inner side of the tray 300 in the upper direction, the latching protrusion 440 of the socket 400, held by the latching protrusion receiving groove 310 of the tray 300, is removed from the latching protrusion receiving groove 310, and moves to the inner direction of the socket 400 via the drawing-out sliding unit 320 of the tray 300, thereby ejecting the tray 300 from the socket 400.

The principle of the ejection of the tray 300 from the socket 400 described above with reference to FIGS. 4A and 4B may be applied to the following embodiments in the same way. Therefore, its detailed description will be omitted in the following description.

Figure 5A:
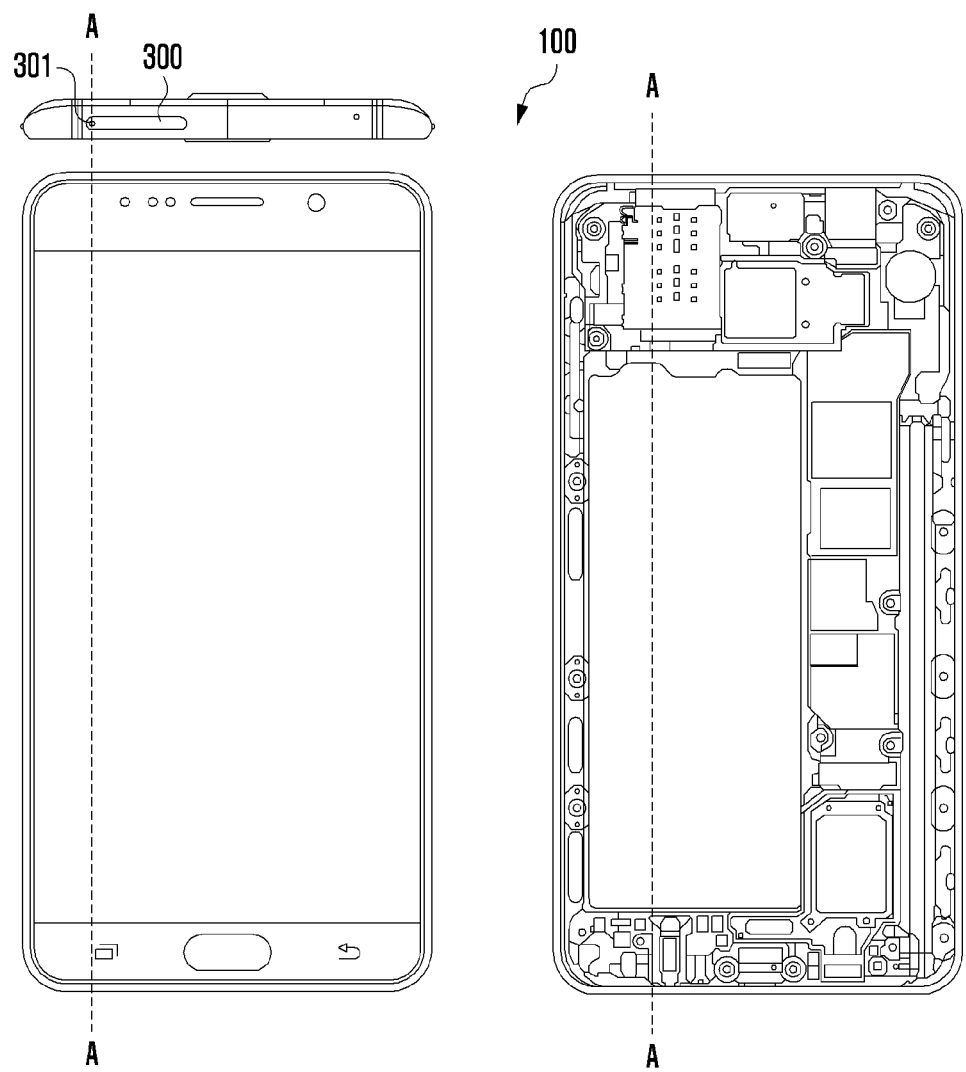
FIG. 5A illustrates views of an electronic device with a seal member according to various embodiments of the present disclosure.

FIG. 5A illustrates views of an electronic device with a seal member according to various embodiments of the present disclosure.

Figure 5B:
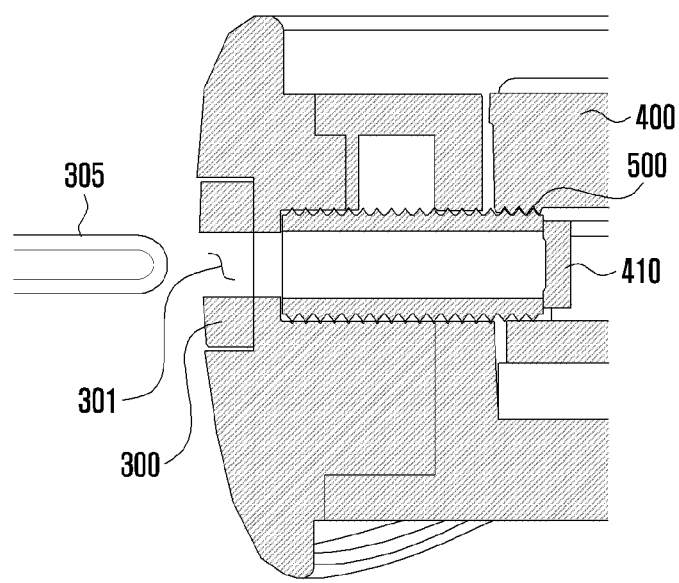
FIG. 5B is a cross-sectional view, taken along line A-A in FIG. 5A according to various embodiments of the present disclosure.

FIG. 5B is a partial cross-sectional view, taken along line A-A in FIG. 5A according to various embodiments of the present disclosure.

Referring to FIGS. 5A and 5B, an electronic device 100 includes a seal member 500 between an opening (hole) 301 of a tray 300 and an actuator 410 of a socket 400.

Figure 6A:
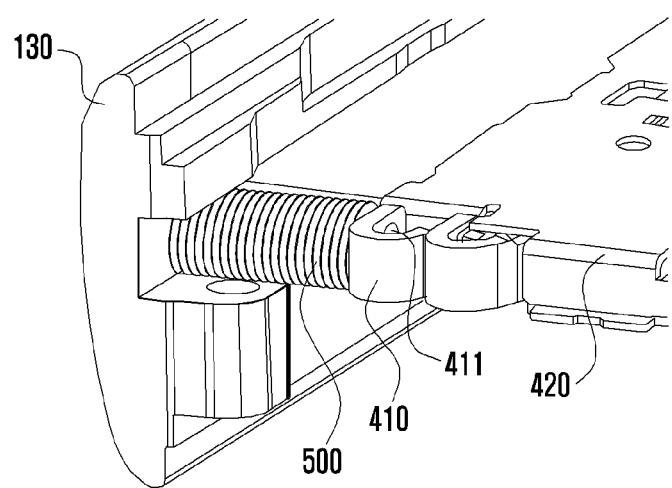
FIG. 6A is a perspective view of an electronic device with a seal member according to various embodiments of the present disclosure.
Figure 6B:
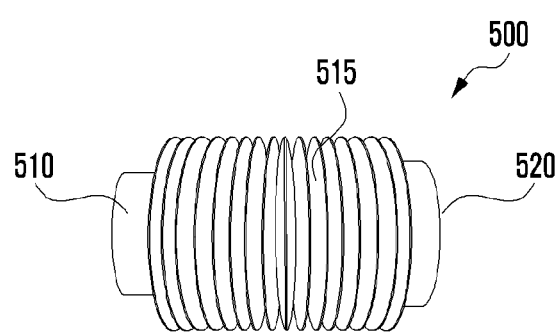
FIG. 6B is a diagram of a seal member according to various embodiments of the present disclosure.
Figure 6C:
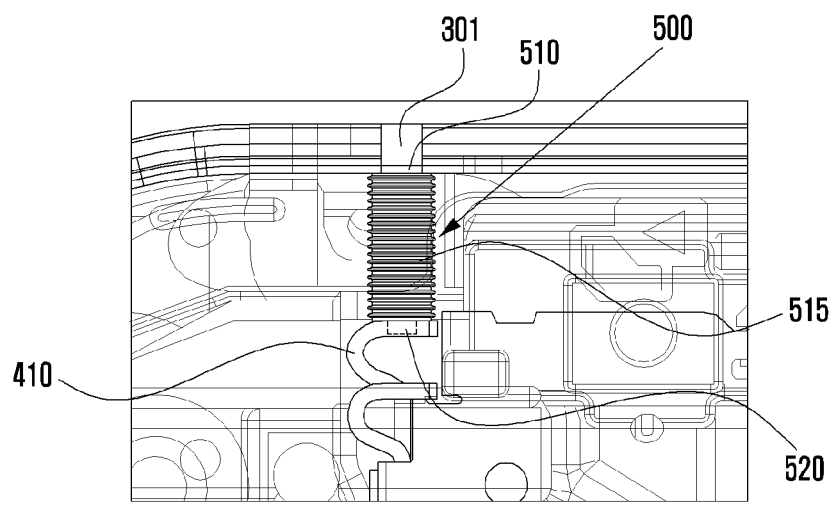
FIG. 6C is a detailed view of an electronic device with a seal member according to various embodiments of the present disclosure.

FIG. 6A is a perspective view of an electronic device with a seal member according to various embodiments of the present disclosure. FIG. 6B is a diagram of a seal member according to various embodiments of the present disclosure. FIG. 6C is a detailed view of an electronic device with a seal member according to various embodiments of the present disclosure.

Referring to FIGS. 6A to 6C, a seal member 500 according to various embodiments of the present disclosure is designed to include a first end 510, a body part 515 and a second end 520 which are united into a single body.

The first end 510 and second end 520 of the seal member 500 are shaped as a cylindrical form. The body part 515 is shaped as a bellows pipe form with elasticity. The body part 515 may be formed between the first end 510 and the second end 520. That is, the body part 515 is designed to be a bellows pipe which can be extended and contracted (compressed) between the first end 510 and the second end 520. The body part 515 has an external diameter greater than those of the first end 510 and the second end 520, respectively.

The first end 510 of the seal member 500 is inserted into and fixed to the opening (hole) 301 of the tray 300. The second end 520 is inserted into and fixed to an insertion hole 411 formed at the end of the actuator 410.

In various embodiments, the first end 510 inserted to the opening (hole) 301 may be open to receive the tray ejector pin 305 from the outside. The second end 520 inserted to the insertion hole 411 may be closed to transfer force from the tray ejector pin 305 to the push rod 420. Since the second end 520 is closed, it is capable of performing a waterproof and dustproof function.

In various embodiments, the first end 510 and the body part 515 may be made of a material which differs from that of the second end 520. The first end 510 and the body part 515 may be made of at least one of the following: rubber, silicon, and urethane, which are resilient. The second end 520 may be made of a polymer which is tear-resistant against the repetition of contact and compression of the tray ejector pin 305. For example, the polymer may be at least one of the following: Nylon Ripstop, PolyEthylene (PE), PolyPropylene (PP), PolyCarbonate (PC), PolyEthylene-TerePhthalate (PETP) and PolyURethane (PUR). It should be understood that the second end 520 may also be implemented with any types of material if they are tear-resistant.

Figure 7:
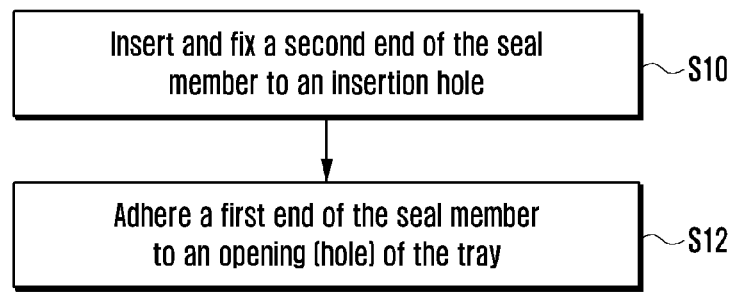
FIG. 7 is a flowchart that describes a method of assembling a seal member to an electronic device according to various embodiments of the present disclosure.

FIG. 7 is a flowchart that describes a method of assembling a seal member to an electronic device according to various embodiments of the present disclosure.

In various embodiments, the seal member 500 is assembled to the electronic device 100 in such a way that: the second end 520 is inserted into and adhered to an insertion hole 411 formed at the end of the actuator 410 in the socket 400 at operation S10; and the first end 510 is inserted into and adhered to the opening (hole) 301 of the tray 300 at operation S12.

Figure 8:
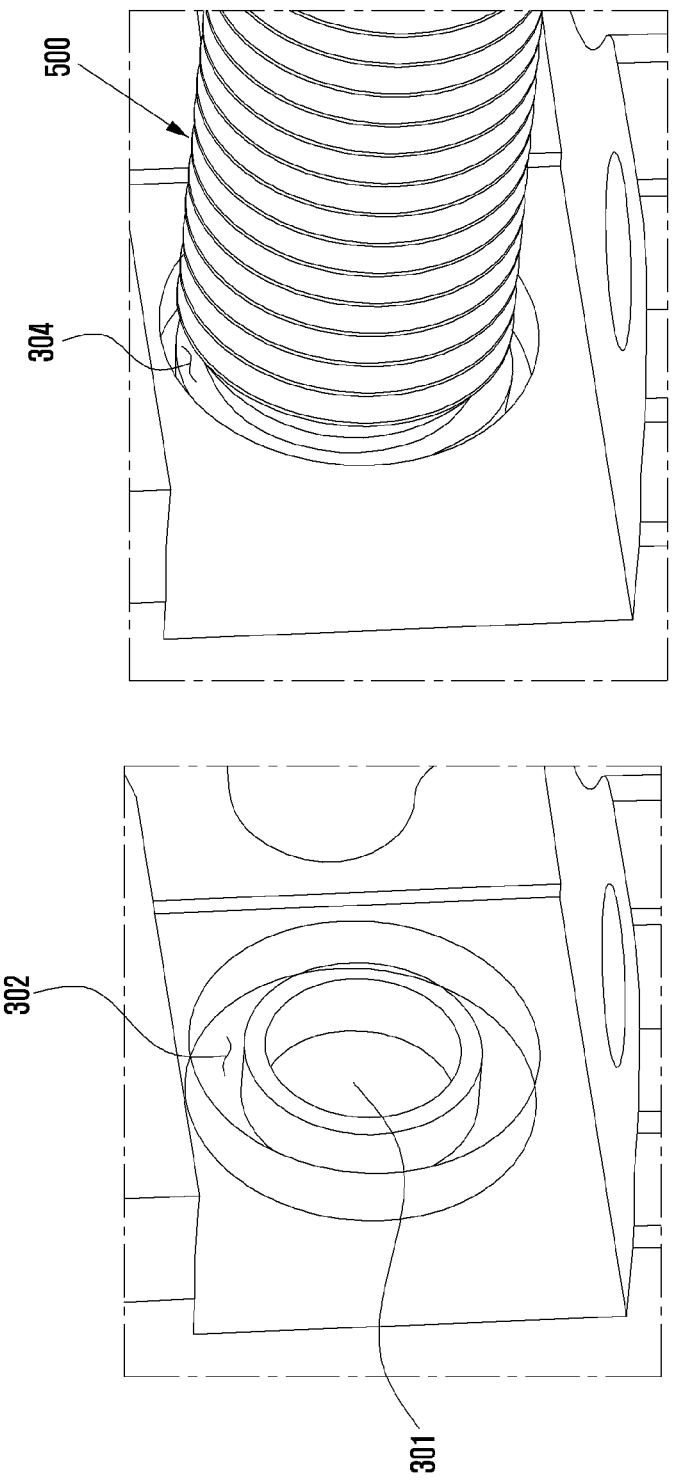
FIG. 8 illustrates diagrams of a state where one end of a seal member is placed in a placement groove close to an opening (hole), according to various embodiments of the present disclosure.

FIG. 8 illustrates diagrams of a state where one end of a seal member is placed in a placement groove close to an opening (hole), according to various embodiments of the present disclosure.

Referring to FIG. 8 and FIGS. 6A to 6C, a seal member 500 may be designed to include a body part 515, shaped as a bellows, and a second end 520, without a first end 510. Alternatively, the seal member 500 may be designed to include a body part 515 shaped as a bellows, without a first end 510 and a second end 520. In this case, the seal member 500 may have the same external diameter. If the seal member 500 is designed to include a body part 515, one end of the seal member 500 is open to receive a tray ejector pin 305 and the other end is closed to receive push force from the tray ejector pin 305.

In this case, a placement groove 302 is formed on the inner wall of the opening (hole) 301 of the tray 300. One end of the seal member 500 is adhered to the placement groove 302 by an adhesive, e.g., a double side adhesive tape.

In various embodiments, an adhesive, e.g., a double side adhesive tape, is applied to the placement groove 302; one end of a cover 304, shaped as a form corresponding to that of the placement groove 302, is adhered to the adhesive; and one end of the seal member 500 is adhered to the other end of the cover 304. That is, the cover 304 is disposed between the placement groove 302 and the seal member 500, so that one end of the seal member 500 is tightly coupled to the placement groove 302.

Figure 9:
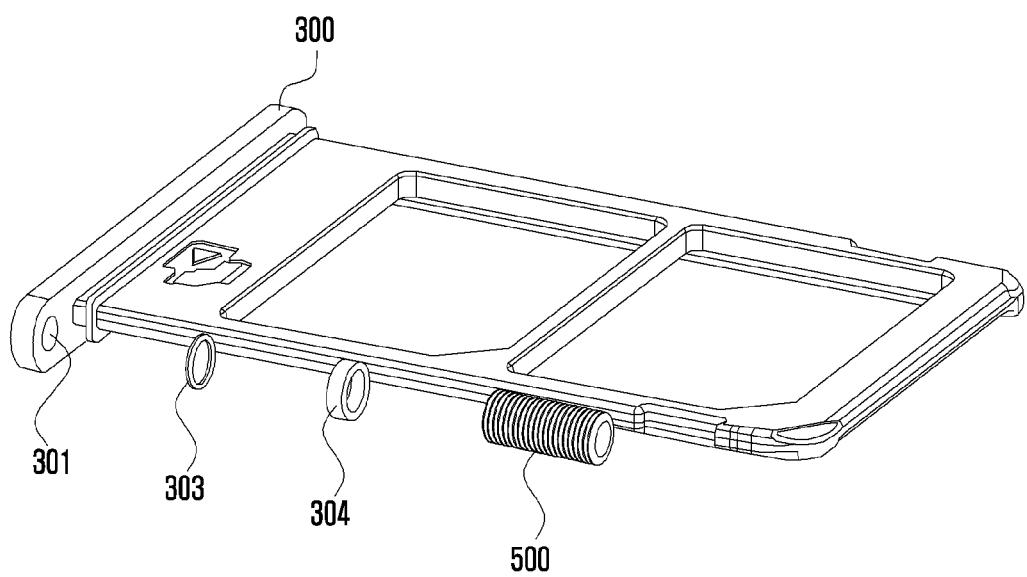
FIG. 9 is a perspective view illustrating a state where one end of a seal member is placed close to an opening (hole), according to various embodiments of the present disclosure.

FIG. 9 is a perspective view illustrating a state where one end of a seal member is placed close to an opening (hole), according to various embodiments of the present disclosure.

Referring to FIG. 9, a tray 300 may be implemented in such a way that it does not form the placement groove 302, shown in FIG. 8, on the inside of its opening (hole) 301.

In this case, an adhesive 303 such as a double side adhesive tape is applied to the inner wall of the opening (hole) 301 of the tray 300; one end of the cover 304 shaped as a cylindrical form is adhered to the adhesive 303; and one end of the seal member 500 is adhered to the other end of the cover 304.

Figure 10A:
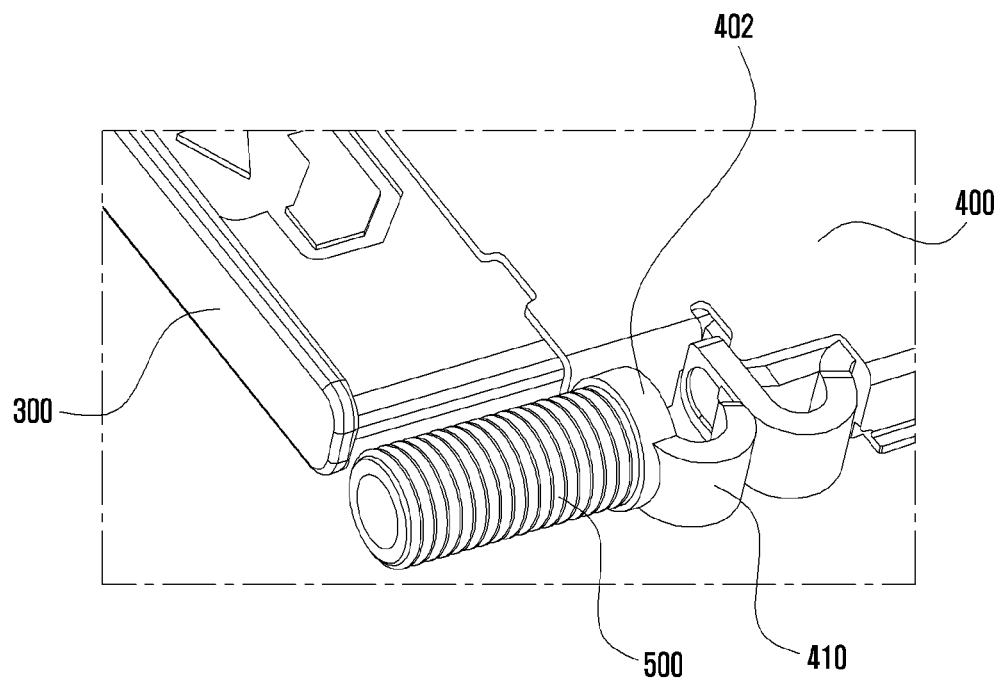
FIGS. 10A and 10B illustrate diagrams of a state where the other end of the seal member is placed to an actuator of the socket, according to various embodiments of the present disclosure.
Figure 10B:
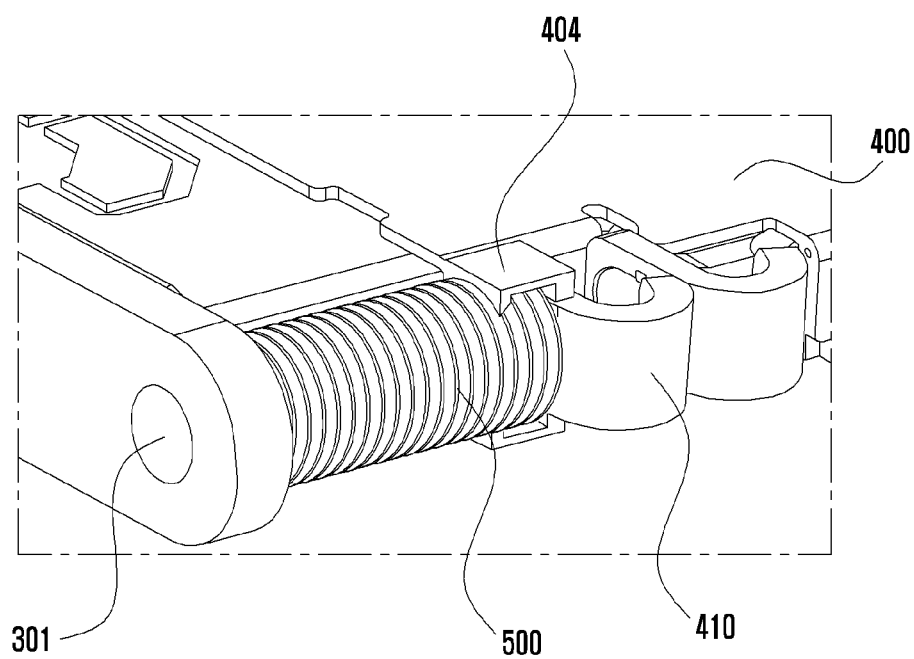

FIGS. 10A and 10B show diagrams of a state where the other end of the seal member is placed to an actuator of the socket, according to various embodiments of the present disclosure.

Referring to FIG. 10A, the actuator 410 installed to one side of the socket 400 is capable of including a cylindrical receiving unit, whose one side is open and whose other side is closed, for receiving the other end of the seal member 500 and fixing the end to its one end.

Referring to FIG. 10B, the actuator 410 of the socket 400 is capable of including a c-clamp-type coupling unit 404. The c-clamping coupling unit 404 holds the pleats of the seal member 500 from the top and bottom, facing the other end of the seal member 500.

Figure 11:
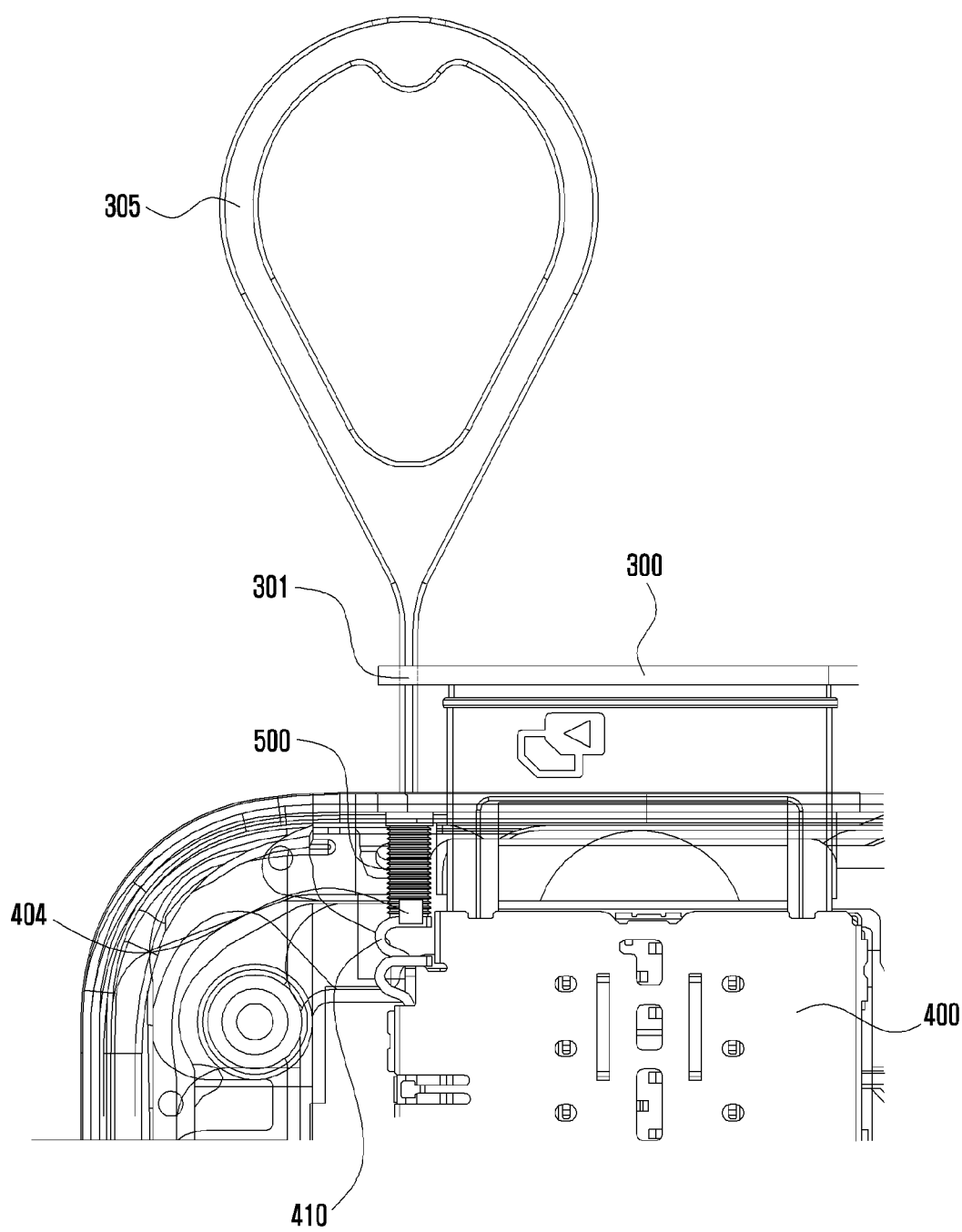
FIG. 11 is a diagram that describes a state where a tray slides out of the socket, according to various embodiments of the present disclosure.

FIG. 11 is a diagram that describes a state where a tray slides out of the socket, according to various embodiments of the present disclosure.

Referring to FIG. 11, the tray ejector pin 305 is inserted into the opening (hole) 301 of the tray 300, and presses the other end of the seal member 500 which faces the actuator 410. The seal member 500 may be shaped as a bellows form.

When the push force of the tray ejector pin 305 compressing/contracting the seal member 500 is removed, the seal member 500 is extended in length and simultaneously the tray 300 is slid out of the socket 400 of the electronic device.

Figure 12:
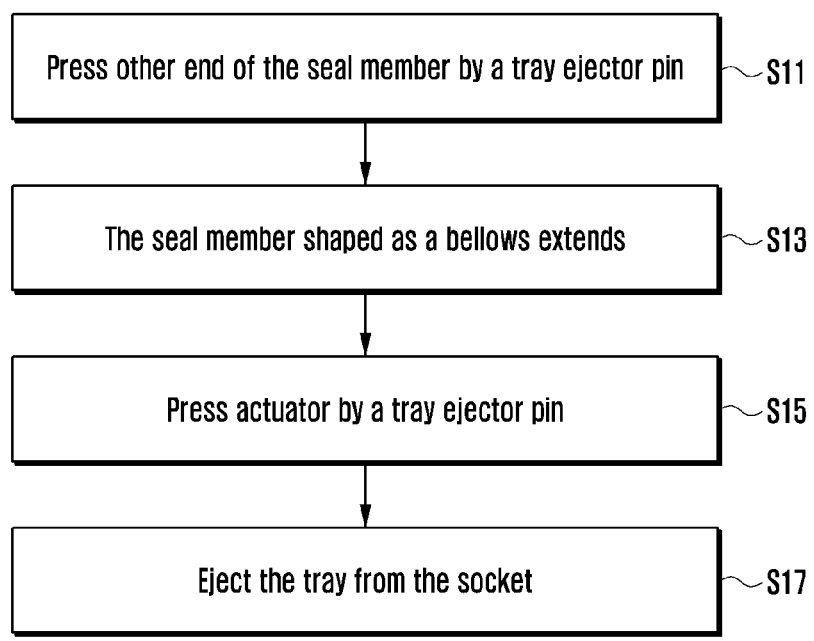
FIG. 12 is a flowchart that describes a method of drawing out a tray shown in FIG. 11 according to various embodiments of the present disclosure.

FIG. 12 is a flowchart that describes a method of drawing out a tray shown in FIG. 11 according to various embodiments of the present disclosure.

In various embodiments, the tray ejector pin 305 presses the other end of the seal member 500 at operation S11. The seal member 500, shaped as a bellows form, is compressed/contracted and then extended at operation S13. The tray ejector pin 305 presses the actuator 410 at operation S15. The tray 300 is slid out of the socket 400 of the electronic device at operation S17.

The principle of the operation of the tray ejector pin 305, the seal member 500, the actuator 410 and the socket 400 was described above with reference to FIGS. 4A and 4B, a detailed description is omitted below.

FIGS. 13A, 13B, 14A, 14B, and 15 are diagrams illustrating a seal member according to various embodiments of the present disclosure.

Referring to FIGS. 13A, 13B, 14A, 14B, and 15, the seal member 500 blocks the end of a guide unit 505 linked to the opening (hole) 301 of the tray 300, thereby performing a waterproof and dustproof function.

In various embodiments, the guide unit 505 may be a cylindrical pipe which is integrated with the opening (hole) 301, forming a single body.

Figure 14A:
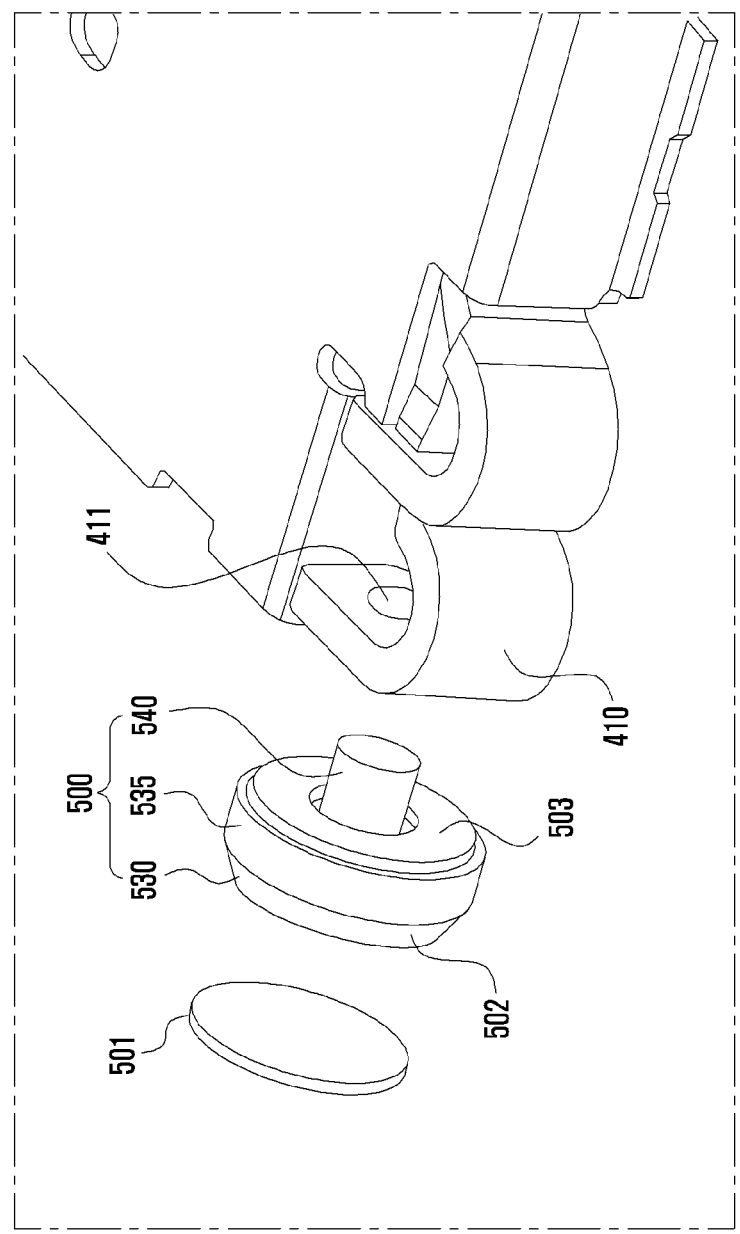
Figure 14B:
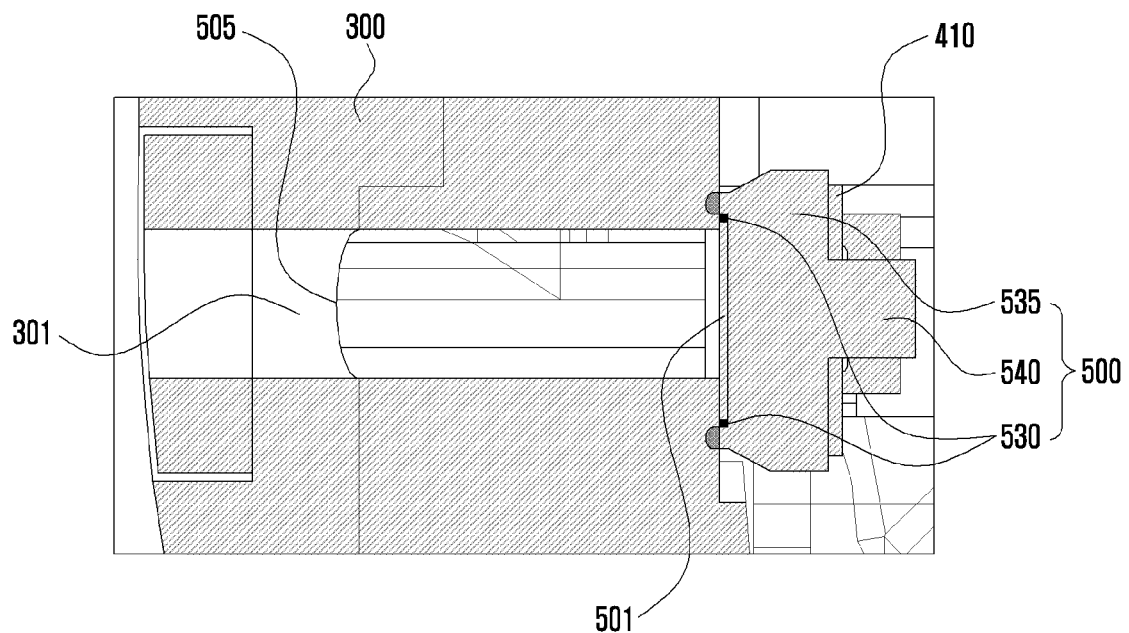
Figure 15:
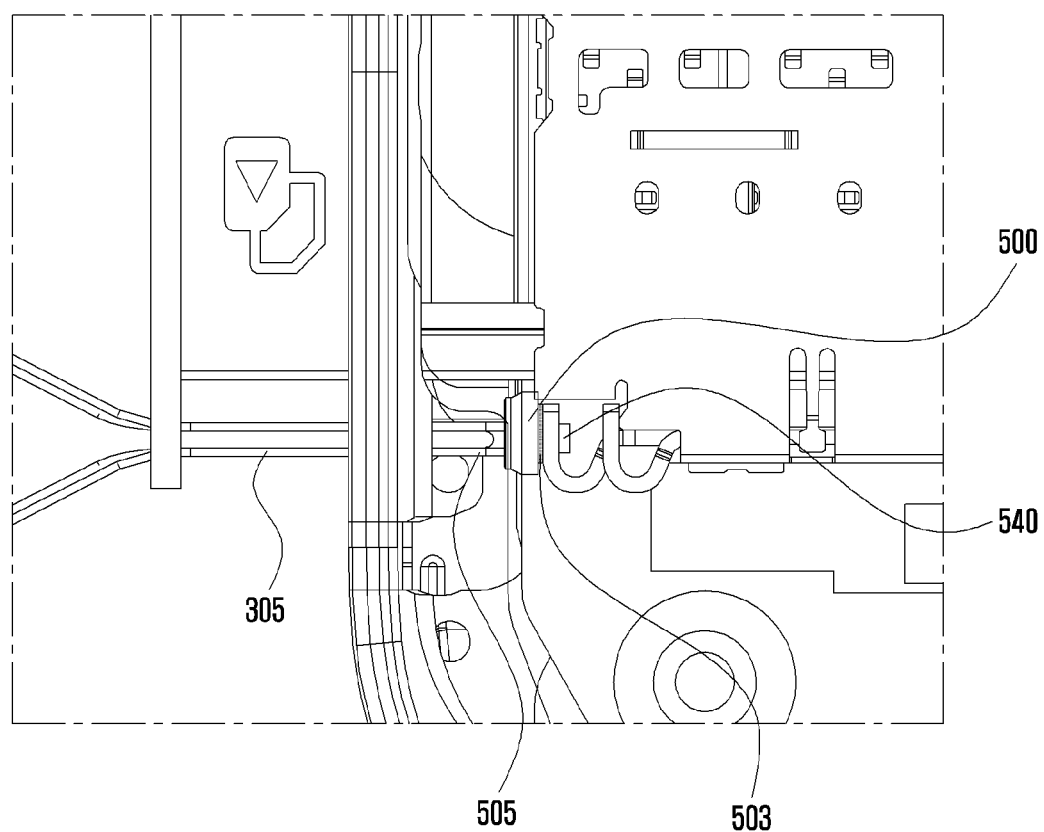

Referring to FIGS. 14A and 14B, the seal member 500 is capable of including a first end 530, a body part 535 and a second end 540 which are connected to each other, forming a single body.

Figure 13A:
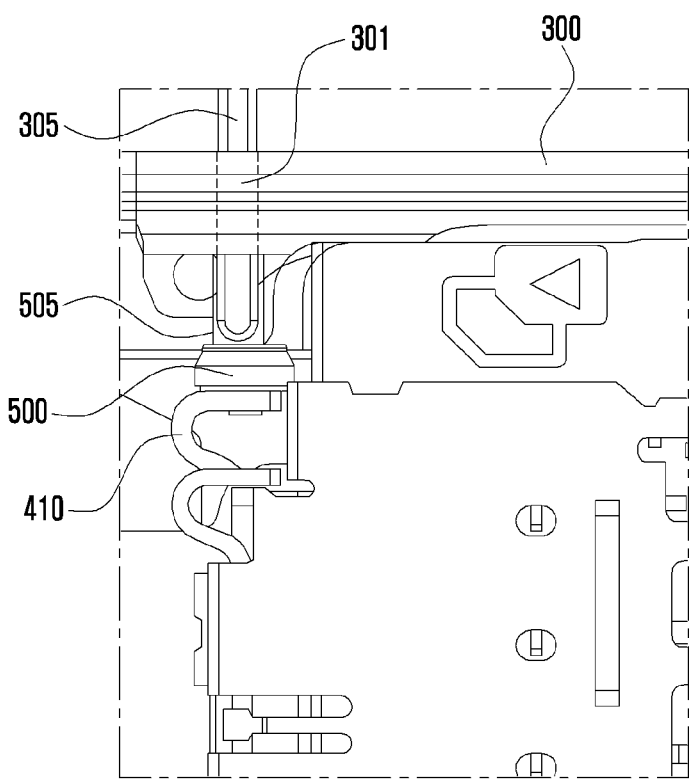
FIGS. 13A, 13B, 14A, 14B, and 15 are diagrams illustrating a seal member according to various embodiments of the present disclosure.
Figure 13B:
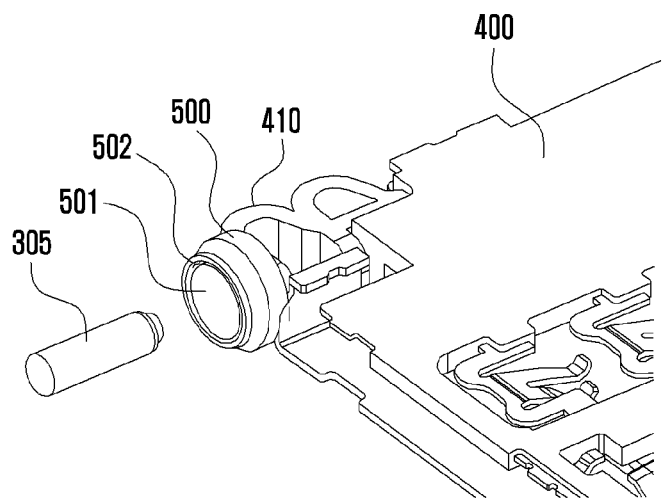

Referring to FIGS. 13A and 13B and FIG. 14A, the first end 530 is capable of including a receiving groove 502 in the inner side. The receiving groove 502 receives a protection member 501 facing the tray ejector pin 305. The protection member 501 may be made of a polymer which is tear-resistant against the repetition of contact and compression of the tray ejector pin 305 while the tray ejector pin 305 passes through the guide unit 505. The first end 530 may be formed to be higher than the protection member 501 inserted into the receiving groove 502.

Referring to FIGS. 14A and 14B, a body part 535 may be designed to have a preset thickness. The body part 535 has a diameter greater than that of the first end 530.

The second end 540 is shaped as a rod which is integrated with the body part 535 and extends from the center of the body part 535. The second end 540 is inserted into an insertion hole 411 formed in the actuator 410 of the socket 400. The inside of the body part 535, except for the second end 540, and the outside of the actuator 410, except for the insertion hole 411, are adhered to each other by the adhesive 503.

Referring to FIG. 14B, the first end 530 of the seal member 500 is formed to be higher than the protection member 501 facing the tray ejector pin 305 at the end of the guide unit 505. Therefore, the first end 530 tightly overlaps the housing of the electronic device, thereby performing a waterproof and dustproof function.

Figure 16:
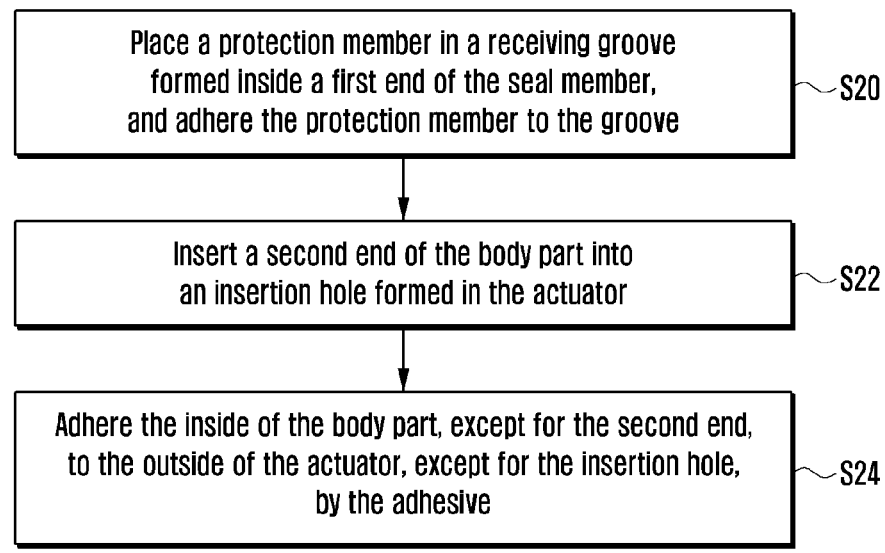
FIG. 16 is a flowchart that describes a method of assembling the seal member, shown in FIGS. 13A, 13B, 14A, 14B, and 15, to an electronic device, according to various embodiments of the present disclosure.

FIG. 16 is a flowchart that describes a method of assembling the seal member, shown in FIGS. 13A, 13B, 14A, 14B, and 15, to an electronic device, according to various embodiments of the present disclosure.

In various embodiments, the protection member 501 is received by and adhered to the receiving groove 502 formed in the inside of the first end 530 of the seal member 500 at operation S20. The second end 540 of the body part 535 is inserted into the insertion hole 411 formed in the actuator 410 at operation S22. The inside of the body part 535, except for the second end 540, and the outside of the actuator 410, except for the insertion hole 411, are adhered to each other by the adhesive 503 at operation S24.

Figure 18:
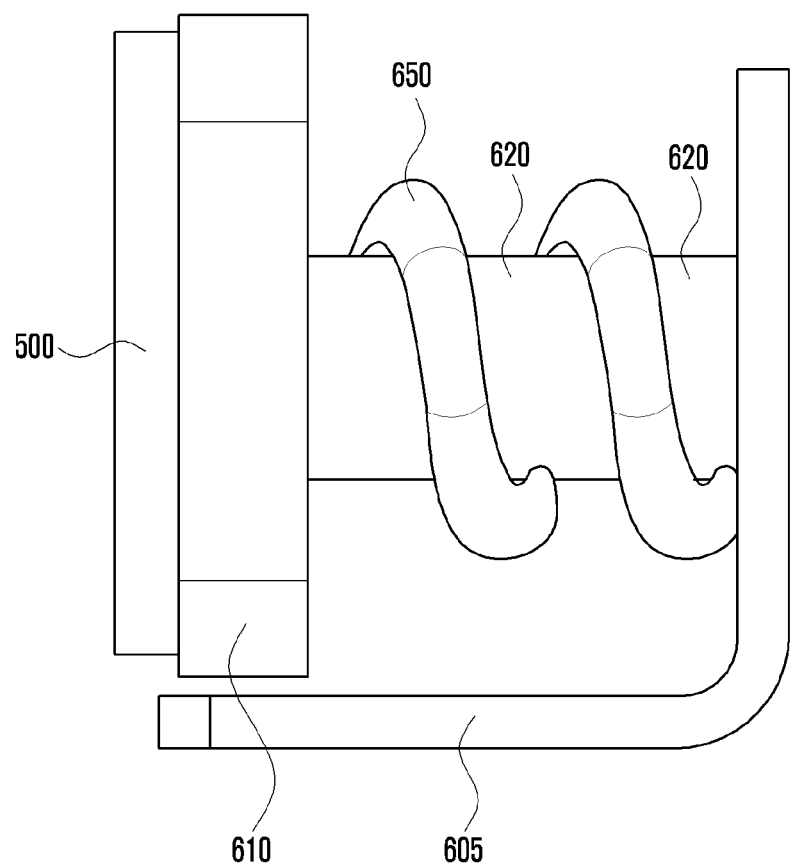

FIGS. 17 and 18 illustrate views of a seal member and a pressing member, according to various embodiments of the present disclosure.

As shown in FIGS. 17 and 18, the seal member 500 is adhered to the outside of the pressing member 600.

In various embodiments, a pressing member 600 is capable of including a fixing bracket 605, a head 610, a body 620, a seal tape 630, a washer 640 and a spring 650.

The fixing bracket 605 is designed to include a bottom plate and an upright plate which is coupled to one end of the bottom plate, to be perpendicular to the bottom plate. The bottom plate is integrally coupled and fixed to the inner frame 240 of the electronic device shown in FIG. 2. The upright plate includes a through-hole formed at a certain position, through which a body 620 of the pressing member 600 passes.

The head 610 is designed as a plate of a thickness. The head 610 integrally couples one side to the seal member 500 and the other side to a body 629 shaped as a bar. The head 610 and body 620 are coupled to each other, forming the letter 'T.' That is, the head 610 may have a diameter greater than that of the body 620.

The body 620 is formed in such a way that: one end is integrally coupled to the other side of the head 610; and the other end forms an external thread external thread 625 on the outer surface. The external thread 625 is coupled with an internal thread 412 formed in the inside of the insertion hole 411 of the actuator 410.

The seal tape 630 is disposed at one side of the upright plate of the fixing bracket 605. The seal tape 630 may be a circular seal member which corresponds in size to a hole formed in the upright plate.

The washer 640 may be disposed in such a way that: one side faces the seal tape 630 and the other side faces one side of the actuator 410.

Referring to FIG. 18, the spring 650 winds around the outer surface of the body 620. One end of the spring 650 is coupled to the other side of the head 610, and the other end is coupled to the inside of the upright plate of the fixing bracket 605.

Figure 19:
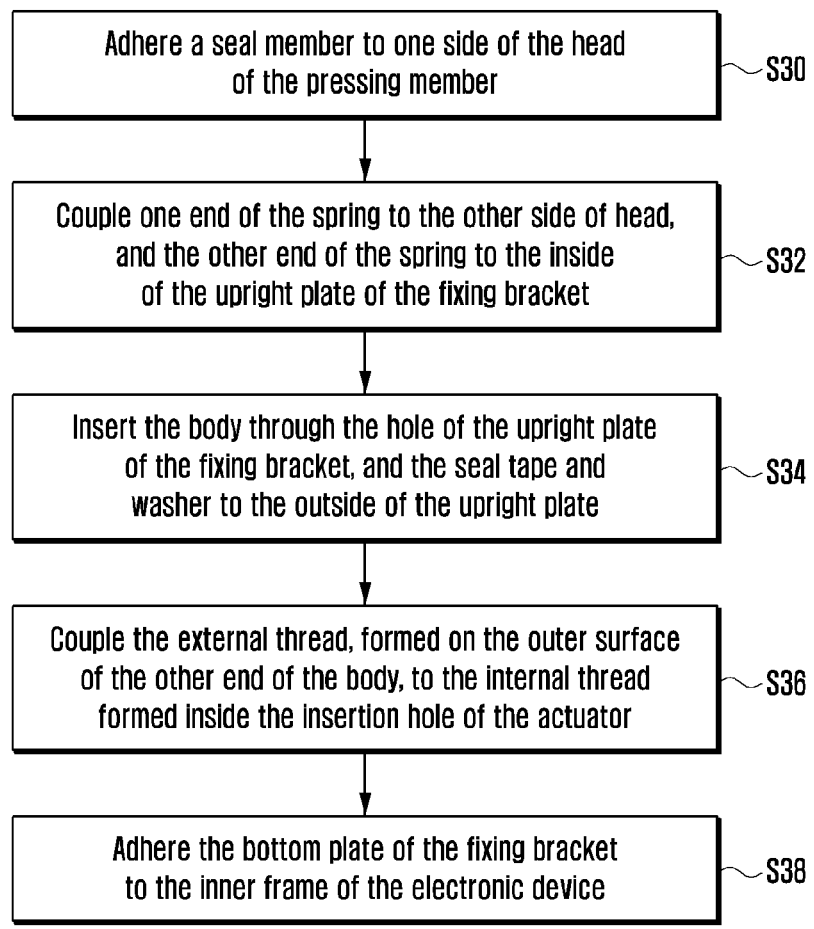
FIG. 19 is a flowchart that describes a method of assembling a seal member, shown in FIGS. 17 and 18, to an electronic device, according to various embodiments of the present disclosure.

FIG. 19 is a flowchart that describes a method of assembling a seal member, shown in FIGS. 17 and 18, to an electronic device, according to various embodiments of the present disclosure.

In various embodiments, the seal member 500 is adhered to one side of the head 610 of the pressing member 600 at operation S30. One end of the spring 650 is adhered to the other side of head 610, and the other end of the spring 650 is coupled to the inside of the upright plate of the fixing bracket 605 at operation S32. The body 620 passes through the hole of the upright plate, and the seal tape 630 and washer 640 are applied to the outside of the upright plate at operation S34. The external thread 625 formed on the outer surface of the other end of the body 620 is coupled to the internal thread 412 formed inside the insertion hole 411 of the actuator 410 at operation S36. The bottom plate of the fixing bracket 605 is adhered to the inner frame of the electronic device at operation S38.

Figure 20:
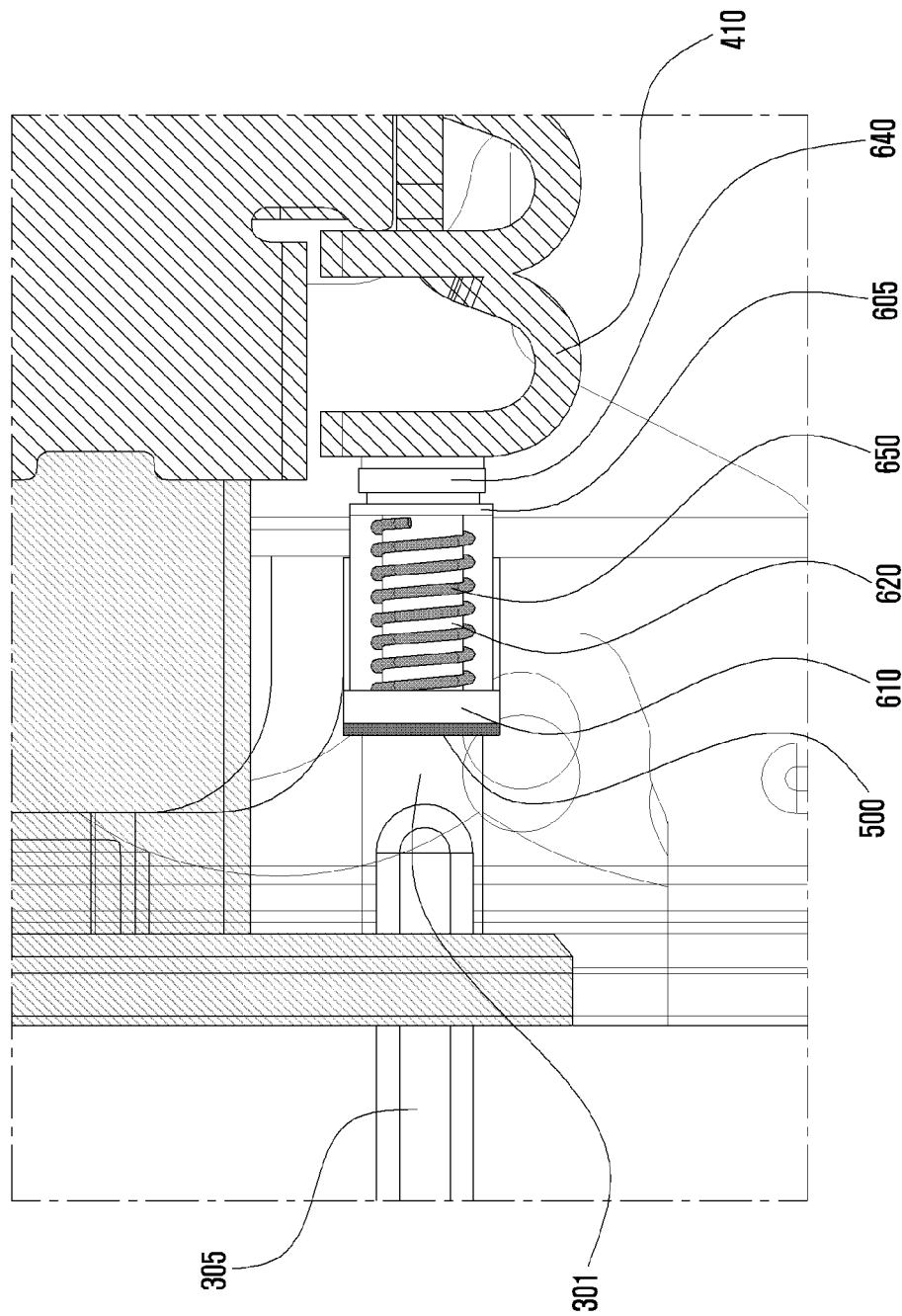
FIGS. 20 and 21 are diagrams that describe the operation of a pressing member according to various embodiments of the present disclosure.
Figure 21:
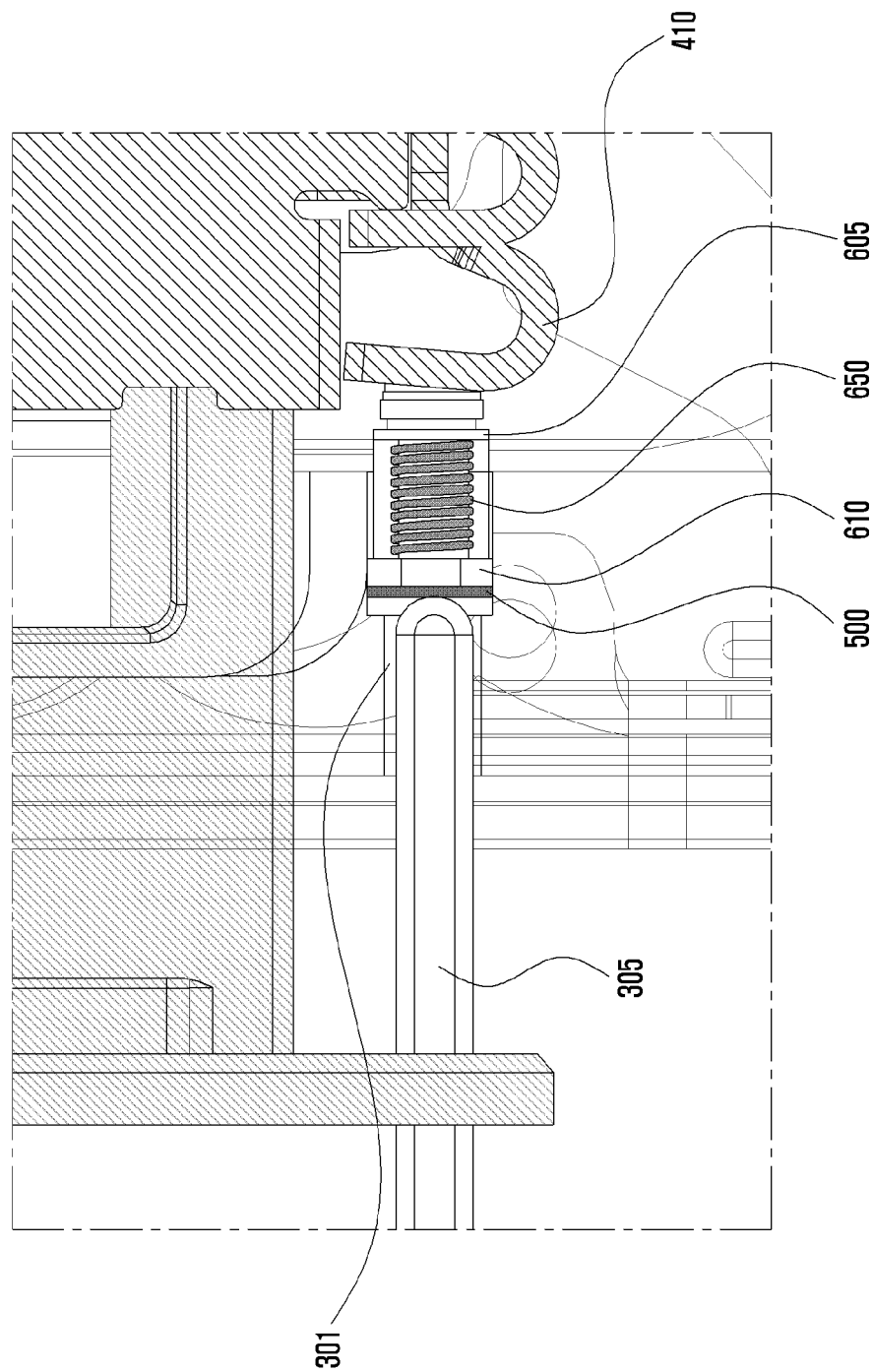

FIGS. 20 and 21 are diagrams that describe the operation of a pressing member according to various embodiments of the present disclosure.

Referring to FIG. 20, the spring 650 of the pressing member 600 is extended on the outer surface of the body 620 between the head 610 and the fixing bracket 605. In this case, the seal member 500, adhered to one side of the head 610 of the pressing member 600, blocks the opening (hole) 301 of the tray 300, thereby performing a waterproof and dustproof function.

Referring to FIG. 21, the tray ejector pin 305 is inserted through the opening (hole) 301, and presses the seal member 500 adhered to one side of the head 610 of the pressing member 600.

When the pressing member 600 receives force applied by the tray ejector pin 305 and seal member 500, it transfers the force to the spring 650. The spring 650 is contracted, and pushes the actuator 410 in the inner direction (with restoring force), thereby ejecting the tray 300.

In various embodiments, if the force of the tray ejector pin 305 applied to the seal member 500 is removed, the spring 650 is restored to the original state (equilibrium position), extending its length. In this case, the seal member 500 blocks the opening (hole) 301, thereby performing a waterproof and dustproof function.

Figure 22:
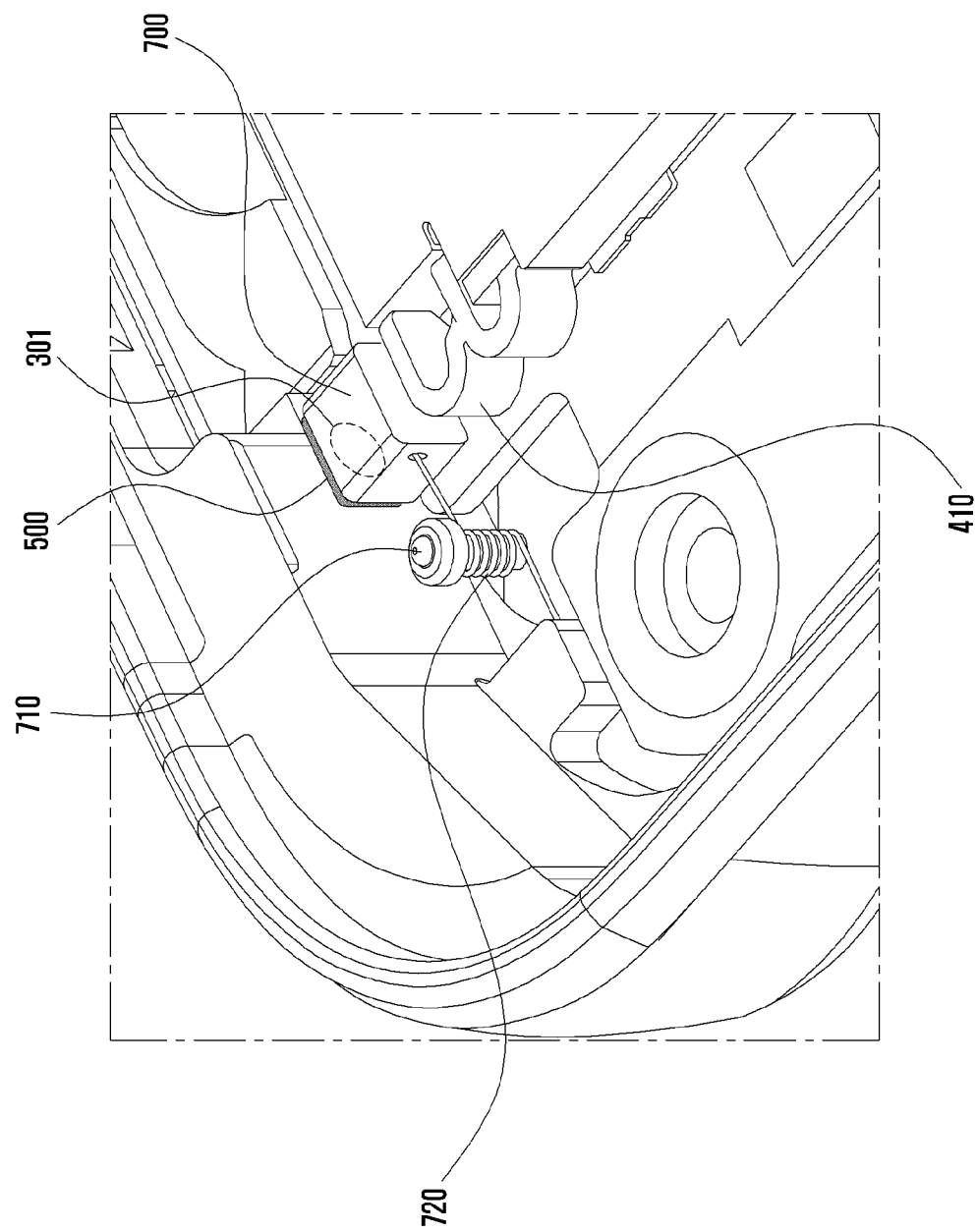
FIGS. 22 to 24 are diagrams that describe the configuration and operation of a seal member and a pressure transmission unit, according to various embodiments of the present disclosure.
Figure 23:
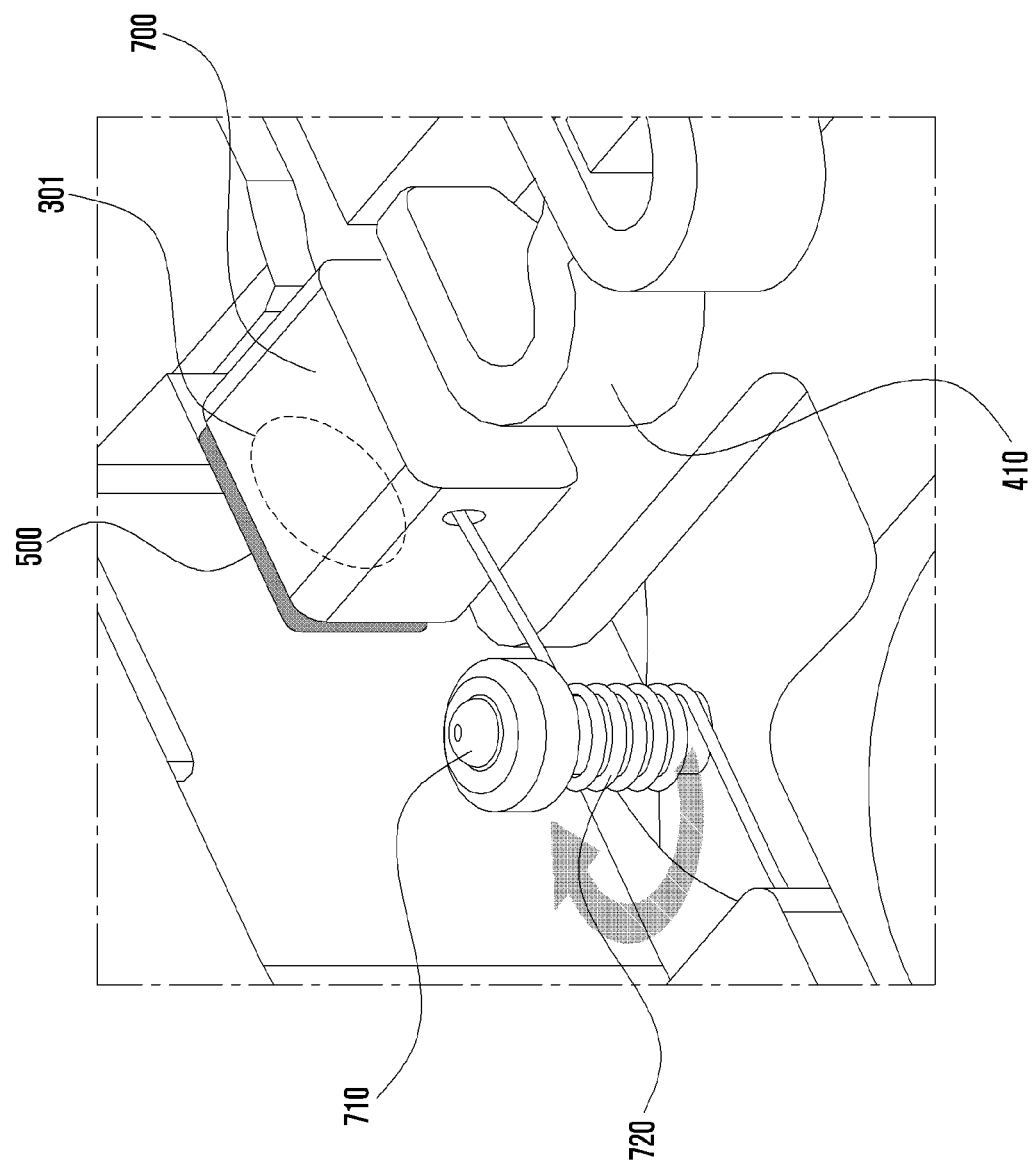
Figure 24:
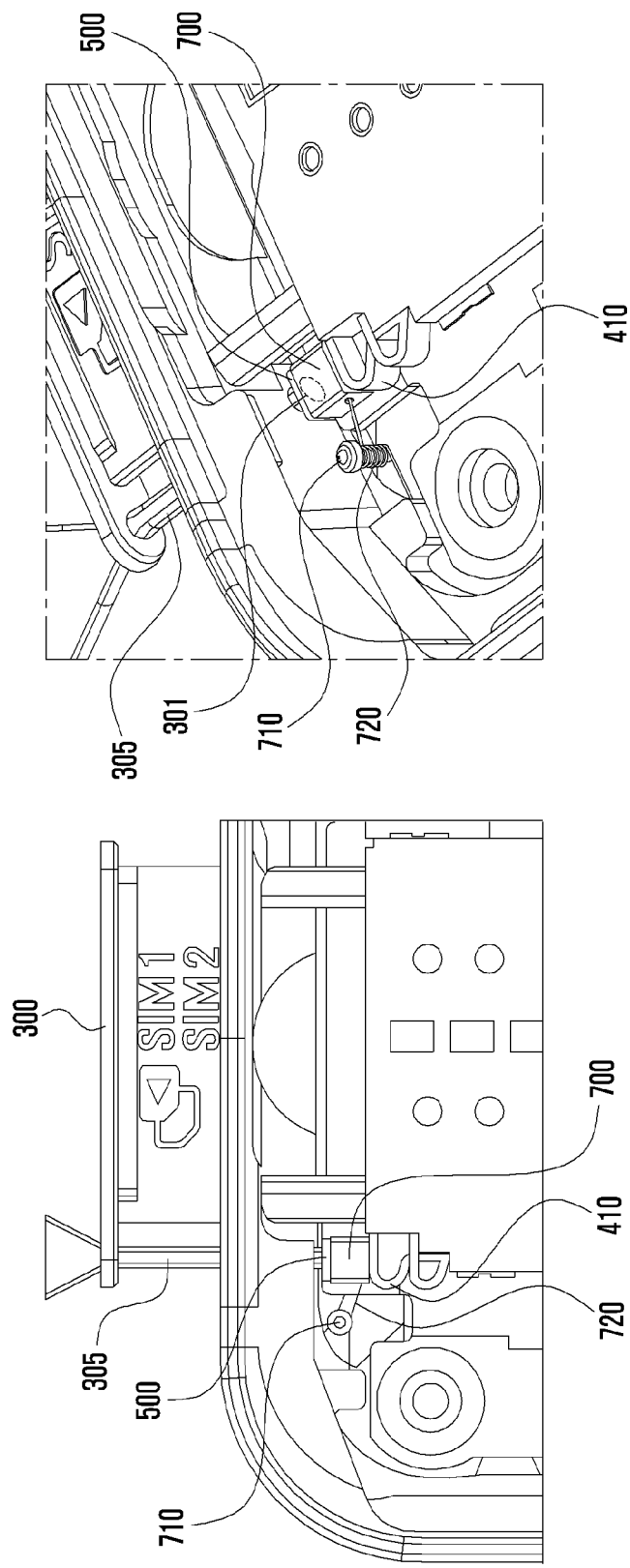

FIGS. 22 to 24 are diagrams that describe the configuration and operation of a seal member and a pressure transmission unit, according to various embodiments of the present disclosure.

Referring to FIGS. 22 and 23, the seal member 500 is adhered to the outside of a pressure transmission unit 700 so that the seal member 500 corresponds to the opening (hole) 301 of the tray 300.

In various embodiments, the pressure transmission unit 700 may be shaped as a rectangular parallelepiped. A first side thereof adheres to the seal member 500, a second side thereof, opposite the first side, faces the actuator 410, and an inside thereof is coupled with and fixed with one end of a hinge spring 720 which will be described later.

A spring fixing shaft 710 is installed close to the pressure transmission unit 700. For example, the spring fixing shaft 710 may be installed/fixed to the inner frame 240 of the electronic device, shown in FIG. 2.

The spring fixing shaft 710 winds a hinge spring 720 on the outer surface so that one end of the hinge spring 720 is fixed to the pressure transmission unit 700 and the other end is fixed to the inner frame 240.

In various embodiments, the hinge spring 720 is adhered to the pressure transmission unit 700 in such a way that: one end of the hinge spring 720 is inserted into the pressure transmission unit 700 whose inside is empty; and the inside is filled with an adhesive.

In various embodiments, if the tray ejector pin 305 does not press the seal member 500, the pressure transmission unit 700 may be spaced apart from the actuator 410, without facing the actuator 410. In this case, the seal member 500 blocks the opening (hole) 301, thereby performing a waterproof and dustproof function.

Referring to FIG. 24, if the tray ejector pin 305 passes through the opening (hole) 301 and presses the seal member 500, one end of the hinge spring 720 moves down and simultaneously the pressure transmission unit 700 presses the actuator 410, thereby ejecting the tray 300 from the electronic device.

In various embodiments, if the tray ejector pin 305 releases the push force applied to the seal member 500, one end of the hinge spring 720 moves in the upper direction and simultaneously the pressure transmission unit 700 restores its original state. In this case, the seal member 500 blocks the opening (hole) 301, thereby performing a waterproof and dustproof function.

Figure 25:
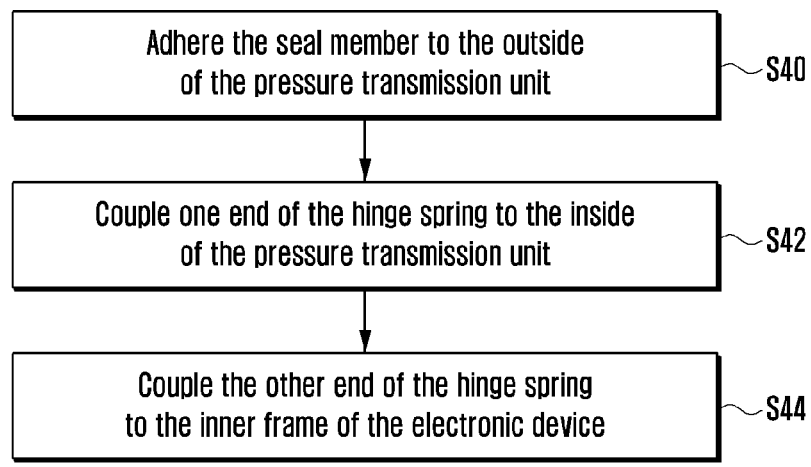
FIG. 25 is a flowchart that describes a method of assembling the seal member and the pressure transmission unit, shown in FIGS. 22 and 24, to an electronic device, according to various embodiments of the present disclosure.

FIG. 25 is a flowchart that describes a method of assembling the seal member and the pressure transmission unit, shown in FIGS. 22 and 24, to an electronic device, according to various embodiments of the present disclosure.

In various embodiments, the seal member 500 is adhered to the outside of the pressure transmission unit 700 at operation S40. The pressure transmission unit 700 couples its inside to one end of the hinge spring 720 at operation S42. The other end of the hinge spring 720 is coupled to the inner frame of the electronic device at operation S44.

Figure 26:
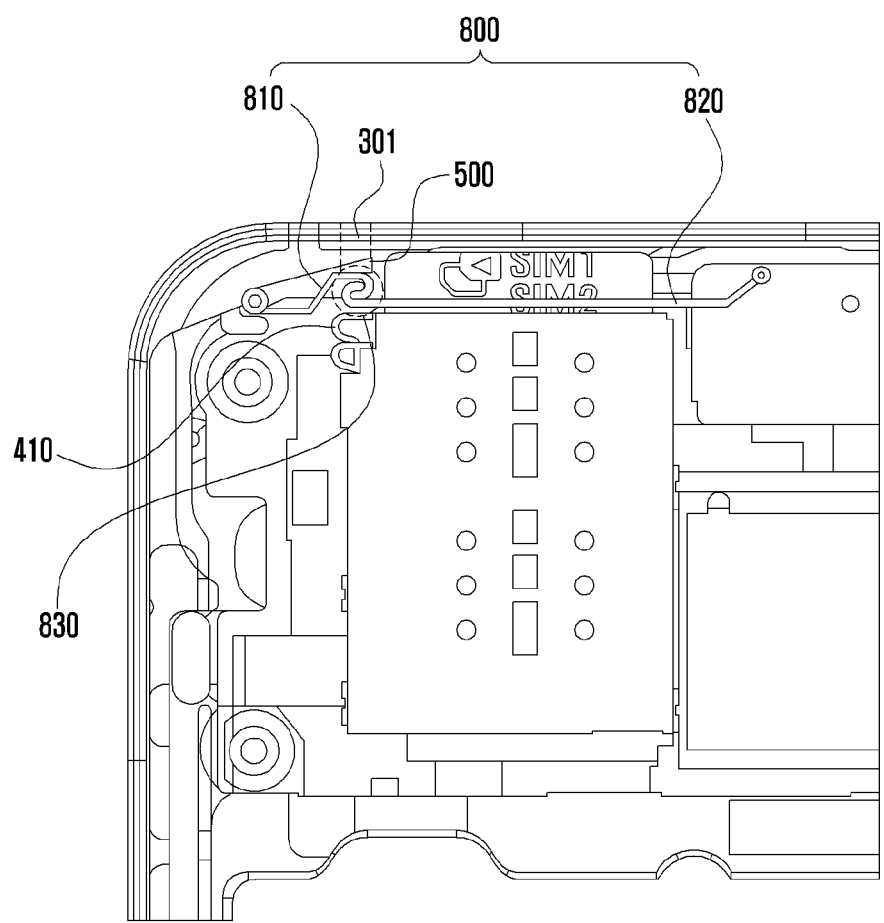
FIGS. 26 and 27 are diagrams that describe the configuration and operation of a seal member and a pressure leaf spring, according to various embodiments of the present disclosure.
Figure 27:
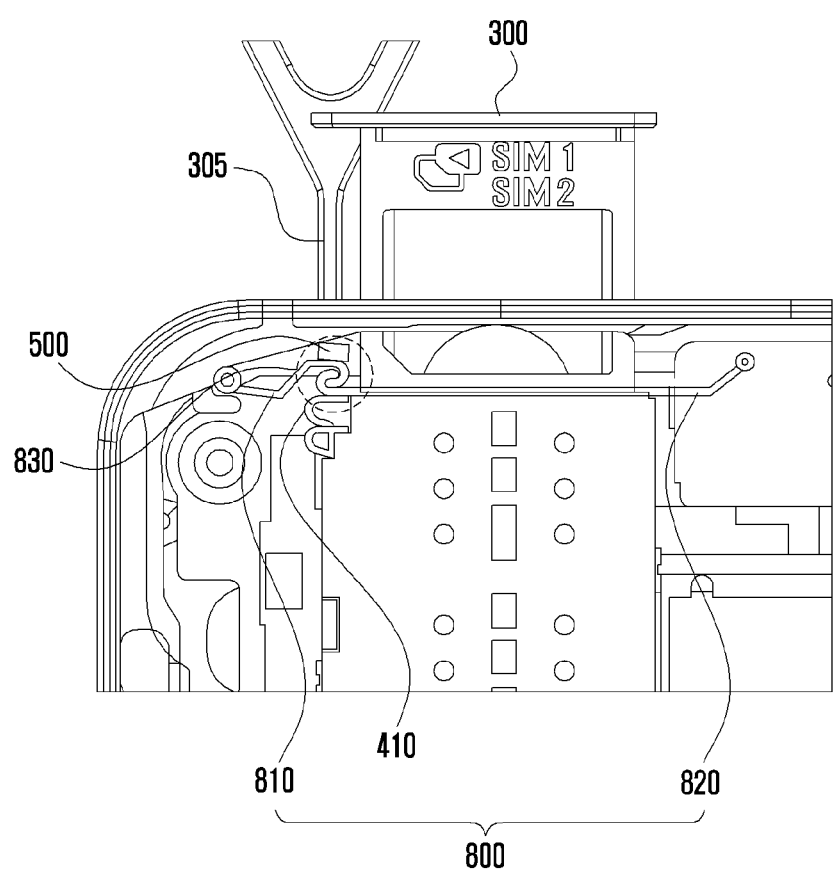

FIGS. 26 and 27 are diagrams that describe the configuration and operation of a seal member and a pressure leaf spring, according to various embodiments of the present disclosure.

Referring to FIGS. 26 and 27, the seal member 500 is adhered to a contact 830 of the pressure leaf spring 800 so that the seal member 500 corresponds to the opening (hole) 301 of the tray 300.

In various embodiments, the pressure leaf spring 800 is designed to include a first leaf spring 810 and a second leaf spring 820.

The first leaf spring 810 is formed as a curved surface in such a way that one end is fixed to the inner frame 240 or the back side 160 of the electronic device shown in FIG. 2 and the other end is bent downward.

The second leaf spring 820 is formed as a curved surface in such a way that one end is bent upward and the other end is fixed to the inner frame 240 or the back side 160 of the electronic device.

The downward curved surface of the other end of the first leaf spring 810 and the upward curved surface of one end of the second leaf spring 820 form a contact 830, and are rotatably coupled to each other. The contact 830 reciprocates up and down.

In various embodiments, the seal member 500 is adhered to the upper side of the first leaf spring 810 forming the contact 830 so that the seal member 500 corresponds to the opening (hole) 301.

If the tray ejector pin 305 does not press the seal member 500, the contact 830 of the pressure leaf spring 800 may be spaced apart from the actuator 410, without facing the actuator 410. In this case, the seal member 500 blocks the opening (hole) 301, thereby performing a waterproof and dustproof function.

Referring to FIG. 27, if the tray ejector pin 305 passes through the opening (hole) 301 and presses the seal member 500, the contact 830 of the pressure leaf spring 800 moves down and presses the actuator 410, thereby ejecting the tray 300 from the electronic device.

In various embodiments, if the tray ejector pin 305 releases the push force applied to the seal member 500, the contact 830 of the pressure leaf spring 800 restores its original state in the upper direction. In this case, the seal member 500 blocks the opening (hole) 301, thereby performing a waterproof and dustproof function.

Figure 28:
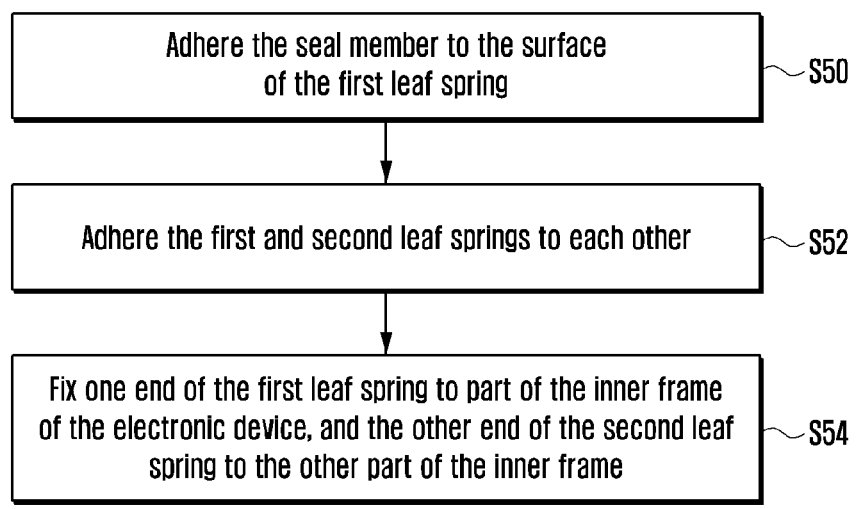
FIG. 28 is a flowchart that describes a method of assembling the seal member and the pressure leaf spring, shown in FIGS. 26 and 27, to an electronic device, according to various embodiments of the present disclosure.

FIG. 28 is a flowchart that describes a method of assembling the seal member and the pressure leaf spring, shown in FIGS. 26 and 27, to an electronic device, according to various embodiments of the present disclosure.

In various embodiments, the seal member 500 is adhered to the surface of the first leaf spring 810 of the pressure leaf spring 800 at operation S50. The other end of the first leaf spring 810 and one end of the second leaf spring 820 are rotatably coupled to each other at operation S52. One end of the first leaf spring 810 is fixed to part of the inner frame of the electronic device and the other end of the second leaf spring 820 is fixed to the other part of the inner frame at operation S54.

As described above, various embodiments of the present disclosure are capable of performing, via various types of seal members, a waterproof and dustproof function for an opening (hole) which is formed to eject a tray of mobile electronic devices.

Various embodiments of the present disclosure are capable of performing, via a seal member, a waterproof and dustproof function for electronic devices with a socket.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A portable communication device comprising:
    a housing forming at least part of an exterior of the portable communication device, the housing including a first opening and a second opening formed adjacent to each other, the first opening having a first size and the second opening having a second size smaller than the first size;
    a tray adapted to be inserted into the housing through the first opening;
    a socket accommodated in the housing, the socket including:
        a first member to hold the tray inserted into the housing through the first opening, and
        a second member to release a portion of the tray toward an outside of the portable communication device in response to an external member being inserted into the housing through the second opening and the tray; and
    a seal member fixed to the second member to seal an inner end of the second opening.

2. The portable communication device of claim 1, wherein the seal member includes a rod-shaped portion formed on a first surface of the seal member facing the second member and in contacted with at least a portion of the second member.

3. The portable communication device of claim 1, wherein the seal member includes:
    a protrusion formed on an edge area of a second surface of the seal member, the second surface of the seal member facing the second opening; and
    a shield member disposed on a central area of the second surface of the seal member.

4. The portable communication device of claim 3, wherein the housing includes a recess formed adjacent to the inner end of the second opening and in contact with the protrusion such that the seal member is to be fastened between the inner end of the second opening and the second surface of the seal member.

5. The portable communication device of claim 1, wherein the first member comprises a protrusion corresponding to a groove formed in the tray inserted into the housing through the first opening, and wherein the second member comprises an actuator.

6. The portable communication device of claim 1, wherein the first opening is aligned with the socket, and the second opening is aligned with the second member.

7. The portable communication device of claim 1, wherein the tray includes a recess on which a memory card or a subscriber identification module (SIM) card is to be placed, and a cover forming another part of the exterior of the portable communication device while the tray is inserted into the housing.

8. The portable communication device of claim 7, wherein the cover of the tray includes a third opening to be aligned with the second opening while the tray is inserted into the housing.

9. The portable communication device of claim 1, further comprising:
    a pressing member positioned between the seal member and the second member and adapted to press the seal member toward the second opening such that the second opening is sealed by the seal member using a pressure delivered via the pressing member.

10. The portable communication device of claim 9, wherein the pressing member comprises:
    a head portion in contact with the seal member;
    a body portion formed between the head portion and the actuator; and
    a spring positioned inside of the head portion and adapted to surround the body portion.

11. A portable communication device comprising:
    a housing forming at least part of an exterior of the portable communication device including a first opening, and a second opening;
    a tray adapted to be inserted into the housing via the first opening;
    a socket adapted to accommodate the tray inserted into the housing through the first opening, the socket including an actuator adapted to be used to release a portion of the tray toward an outside of the portable communication device in response to an external member inserted into the housing through the second opening;
    a seal member adapted to seal an inner end of the second opening; and
    a fixing member disposed between the actuator and the seal member and adapted to fix the seal member to the actuator.

12. The portable communication device of claim 11, wherein the fixing member comprises:
    a head portion in contact with the seal member;
    a body portion formed between the head portion and the actuator; and
    a spring positioned inside of the head portion and adapted to surround the body portion.

13. The portable communication device of claim 12, wherein the fixing member comprises a bracket including a first plate disposed between the body portion and the actuator, and a second plate extended from an edge area the first plate along the body portion.

14. The portable communication device of claim 11, wherein the fixing member comprises:
    a head portion in contact with the seal member; and
    a spring adapted to surround a protrusion fixed to an inner frame disposed in the housing, the spring including a first end portion in contact with the head portion and a second end portion in contact with the inner frame.

15. The portable communication device of claim 11, wherein the tray includes a recess on which a memory card or a subscriber identification module (SIM) card is to be placed, and a cover forming another part of the exterior of the portable communication device while the tray is inserted into the housing.

16. The portable communication device of claim 15, wherein the cover of the tray includes a third opening to be aligned with the second opening while the tray is inserted into the housing.

17. A portable communication device comprising:
   a housing forming at least part of an exterior of the portable communication device, the housing including a first opening and a second opening formed adjacent to each other;
   a tray adapted to be inserted into the housing through the first opening and being held in position;
   an actuator to release a portion of the tray that has been inserted into the housing toward an outside of the portable communication device in response to an external member being inserted into the housing through the second opening and the tray; and
   a seal member disposed between the actuator and an inner end of the second opening.

18. The portable communication device of claim 17, further comprising:
   a pressing member adapted to press the seal member toward the inner end of the second opening.

19. The portable communication device of claim 17, wherein the seal member is adapted to receive a force from an external member inserted into the housing through the second opening and delivers the force to the actuator.

20. The portable communication device of claim 17, wherein the seal member comprises a shield member formed on a specified surface of the seal member facing the second opening.

* * * * *